United States Patent
Li et al.

(10) Patent No.: US 10,586,849 B2
(45) Date of Patent: Mar. 10, 2020

(54) FIELD EFFECT TRANSISTOR WITH CONTROLLABLE RESISTANCE

(71) Applicant: INTERNATIONAL BUSINESS MACHINES CORPORATION, Armonk, NY (US)

(72) Inventors: Yulong Li, Westchester, NY (US); Paul M. Solomon, Westchester, NY (US); Siyuranga Koswatta, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/434,711

(22) Filed: Jun. 7, 2019

(65) Prior Publication Data

US 2019/0312108 A1 Oct. 10, 2019

Related U.S. Application Data

(63) Continuation of application No. 15/850,098, filed on Dec. 21, 2017, now Pat. No. 10,374,041.

(51) Int. Cl.
*H01L 29/10* (2006.01)
*H01L 29/06* (2006.01)
(Continued)

(52) U.S. Cl.
CPC .... *H01L 29/1045* (2013.01); *H01L 27/10805* (2013.01); *H01L 27/1159* (2013.01);
(Continued)

(58) Field of Classification Search
CPC ......... H01L 21/823821; H01L 27/0924; H01L 29/16–1608
See application file for complete search history.

(56) References Cited

U.S. PATENT DOCUMENTS 5,350,953 A 9/1994 Swenson et al.
5,744,372 A 4/1998 Bulucea
(Continued)

FOREIGN PATENT DOCUMENTS

DE 102005053718 A1 5/2007
EP 2230633 A1 9/2010
JP 2016171216 A 9/2016

OTHER PUBLICATIONS

Gokmen et al., "Acceleration of Deep Neural Network Training with Resistive Cross-Point Devices," arXiv:1603.07341, 2016, pp. 1-19.

(Continued)

*Primary Examiner* — Walter H Swanson
(74) *Attorney, Agent, or Firm* — Cantor Colburn LLP; Vazken Alexanian

(57) ABSTRACT

A method and resulting structures for a semiconductor device includes forming a source terminal of a semiconductor fin on a substrate. An energy barrier is formed on a surface of the source terminal. A channel is formed on a surface of the energy barrier, and a drain terminal is formed on a surface of the channel. The drain terminal and the channel are recessed on either sides of the channel, and the energy barrier is etched in recesses formed by the recessing. The source terminal is recessed using timed etching to remove a portion of the source terminal in the recesses formed by etching the energy barrier. A first bottom spacer is formed on a surface of the source terminal and a sidewall of the semiconductor fin, and a gate stack is formed on the surface of the first bottom spacer.

3 Claims, 39 Drawing Sheets

(51) Int. Cl.

| | |
|---|---|
| *H01L 29/66* | (2006.01) |
| *H01L 29/68* | (2006.01) |
| *H01L 29/49* | (2006.01) |
| *H01L 29/205* | (2006.01) |
| *H01L 29/80* | (2006.01) |
| *H01L 27/11521* | (2017.01) |
| *H01L 27/1159* | (2017.01) |
| *H01L 29/51* | (2006.01) |
| *H01L 29/78* | (2006.01) |
| *H01L 21/28* | (2006.01) |
| *H01L 29/165* | (2006.01) |
| *H01L 27/108* | (2006.01) |
| *H01L 29/788* | (2006.01) |
| *H01L 27/24* | (2006.01) |
| *H01L 29/423* | (2006.01) |

(52) U.S. Cl.
CPC ........ *H01L 27/11521* (2013.01); *H01L 27/24* (2013.01); *H01L 29/0646* (2013.01); *H01L 29/1054* (2013.01); *H01L 29/165* (2013.01); *H01L 29/205* (2013.01); *H01L 29/40111* (2019.08); *H01L 29/40114* (2019.08); *H01L 29/42324* (2013.01); *H01L 29/4983* (2013.01); *H01L 29/516* (2013.01); *H01L 29/66431* (2013.01); *H01L 29/66659* (2013.01); *H01L 29/66977* (2013.01); *H01L 29/685* (2013.01); *H01L 29/785* (2013.01); *H01L 29/7881* (2013.01); *H01L 29/802* (2013.01); *H01L 29/6684* (2013.01); *H01L 29/66825* (2013.01); *H01L 29/788* (2013.01); *H01L 29/78391* (2014.09)

(56) References Cited

U.S. PATENT DOCUMENTS

| | | |
|---|---|---|
| 7,067,381 B1 | 6/2006 | Thurgate |
| 9,659,249 B1 | 5/2017 | Copel |
| 9,712,146 B2 | 7/2017 | Sedighi et al. |
| 9,760,533 B2 | 9/2017 | Fick et al. |
| 10,134,472 B1 | 11/2018 | Leobandung et al. |
| 10,269,425 B2 | 4/2019 | Gokmen et al. |
| 2004/0256692 A1 | 12/2004 | Kunz |
| 2006/0284220 A1 | 12/2006 | Watanabe |
| 2015/0278681 A1 | 10/2015 | Saxena |
| 2015/0318029 A1 | 11/2015 | Liu |
| 2016/0268340 A1 | 9/2016 | Shimabukuro |
| 2019/0221559 A1 | 7/2019 | Han et al. |

OTHER PUBLICATIONS

Kim et al., "Analog CMOS-based Resistive Processing Unit for Deep Neural Network Training," https://arxiv.org/ftp/arxiv/papers/1706/1706.06620.pdf, pp. 1-4.

List of IBM Patents or Patent Applications Treated as Related; Date Filed: Jun. 7, 2019, 2 pages.

Li et al., "Field Effect Transistor With Controllable Resistance," U.S. Appl. No. 15/850,098, filed Dec. 21, 2017.

Ma et al., "Why is Nonvolatile Ferroelectric Memory Field-Effect Transistor Still Elusive?" IEEE Electron Device Letters vol. 23 No. 7 (Jul. 2002): pp. 386-388.

f(x) = f (INPUT 1 * CONNECTION STRENGTH 1 + INPUT 2 * CONNECTION STRENGTH 2)

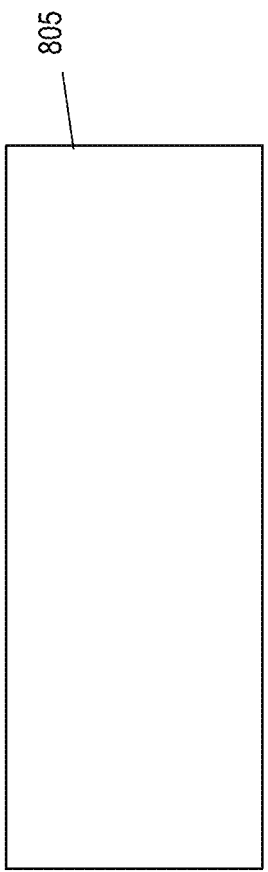
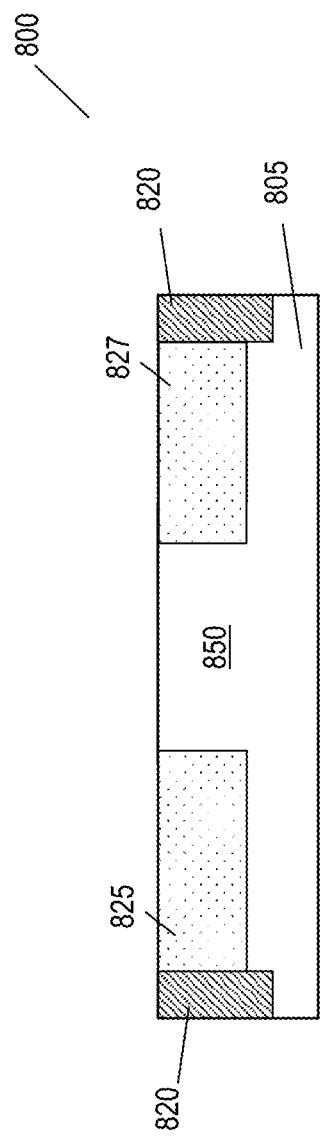
FIG. 8
FIG. 9

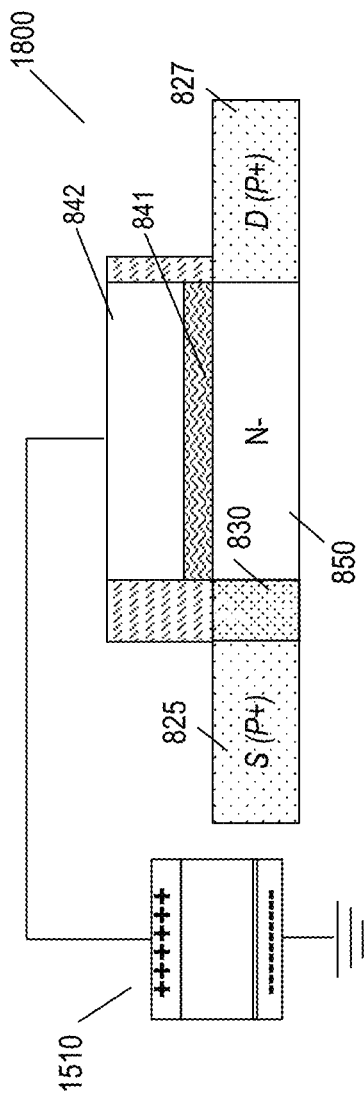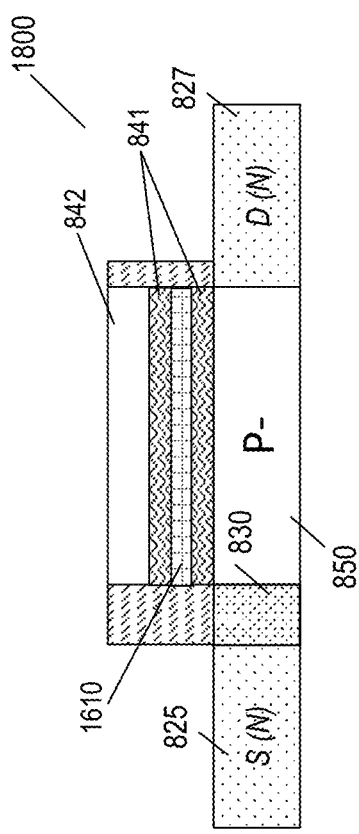
FIG. 21
FIG. 22

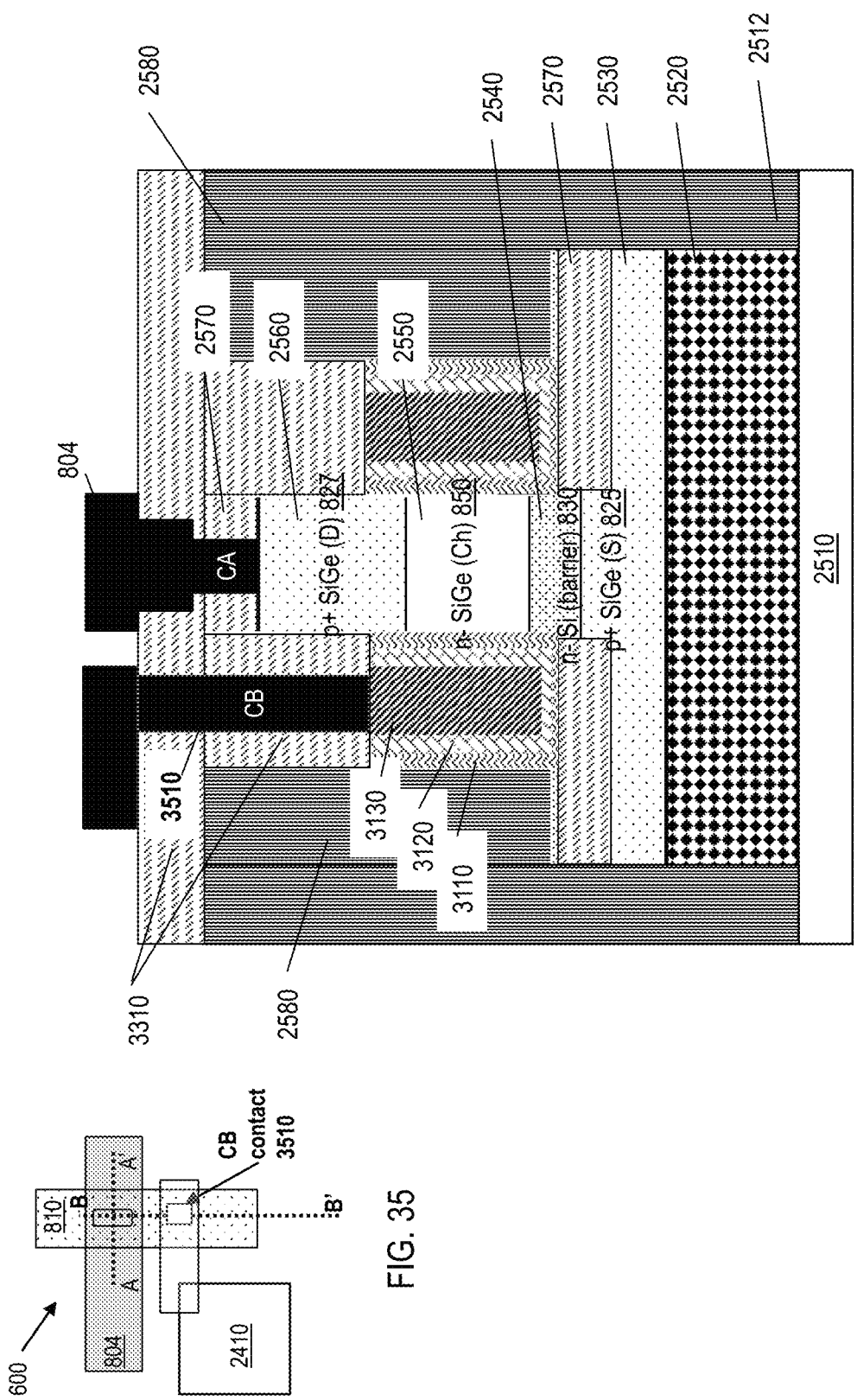

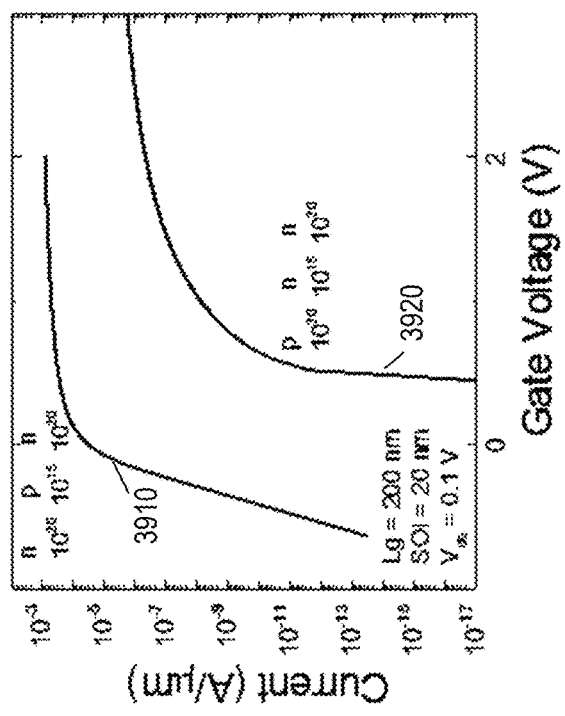
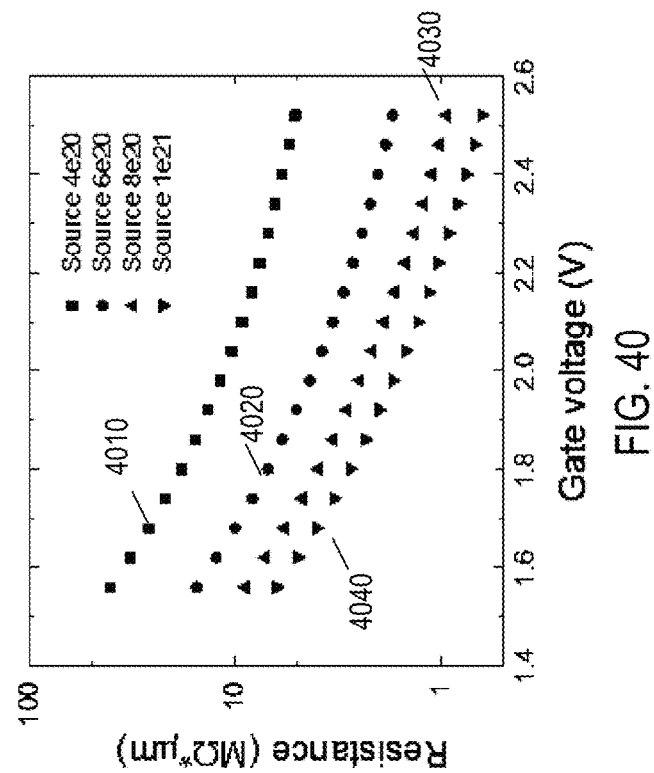

FIELD EFFECT TRANSISTOR WITH CONTROLLABLE RESISTANCE

DOMESTIC PRIORITY

This application is a continuation of U.S. Non-Provisional application Ser. No. 15/850,098, entitled "FIELD EFFECT TRANSISTOR WITH CONTROLLABLE RESISTANCE," filed Dec. 21, 2017, which is incorporated herein by reference in its entirety.

BACKGROUND

The present invention generally relates to fabrication methods and resulting structures for semiconductor devices. More specifically, the present invention relates to field effect transistors (FETs) with controllable resistance, particularly with resistance above a predetermined thresholds.

The present invention also generally relates to fabrication methods and resulting structures for a semiconductor device for use in artificial neural networks (ANNs) formed from crossbar arrays of two-terminal resistive processing units (RPUs) that provide local data storage and local data processing without the need for additional processing elements beyond the two-terminal RPU, thereby accelerating the ANN's ability implement algorithms such as matrix multiplication and the like.

"Machine learning" is used to broadly describe a primary function of electronic systems that learn from data. In machine learning and cognitive science, ANNs are a family of statistical learning models inspired by the biological neural networks of animals, and in particular the brain. ANNs can be used to estimate or approximate systems and functions that depend on a large number of inputs and are generally unknown. Crossbar arrays are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which can be formed from thin film material.

SUMMARY

Embodiments of the present invention are directed to a method for fabricating a semiconductor device. A non-limiting example of the method includes forming a source terminal of a semiconductor fin on a substrate. An energy barrier is formed on a surface of the source terminal. A channel is formed on a surface of the energy barrier, and a drain terminal is formed on a surface of the channel. The drain terminal and the channel are recessed on either sides of the channel, and the energy barrier is etched in recesses formed by the recessing. The source terminal is recessed using timed etching to remove a portion of the source terminal in the recesses formed by etching the energy barrier. A first bottom spacer is formed on a surface of the source terminal and a sidewall of the semiconductor fin, and a gate stack is formed on the surface of the first bottom spacer.

Embodiments of the present invention are directed to a semiconductor device. A non-limiting example of the semiconductor device includes a source terminal and a drain terminal. The source terminal and the drain terminal are formed on either sides of a channel region designated on a substrate. An energy barrier is adjacent to the source terminal and the channel region, and a conductive gate stack is formed over the channel region.

Embodiments of the invention are directed to semiconductor device. A non-limiting example of the semiconductor device includes a semiconductor fin formed on a substrate. The semiconductor fin includes an energy barrier between a source terminal and a channel region of the semiconductor fin. A conductive gate is formed over the channel region of the semiconductor fin, and a bottom spacer is formed between the conductive gate and the substrate.

Embodiments of the invention are directed to semiconductor device. A non-limiting example of the semiconductor device includes a semiconductor fin formed on a substrate. The semiconductor fin includes a source terminal that is doped using a first dopant, a drain terminal that is doped using a second dopant at a first concentration, and a channel that is doped using the second dopant at a second concentration. The second concentration is lower than the first concentration.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 8 depicts a cross sectional view of an example SOI wafer 800 according to one or more embodiments of the present invention;

FIG. 9 depicts an example FET structure according to one or more embodiments of the present invention;

FIG. 21 depicts an embodiment to store the weight in the HBFET 1800 according to one or more embodiments of the present invention;

FIG. 22 depicts an embodiment to store the weight in the HBFET 1800 according to one or more embodiments of the present invention;

FIG. 35 depicts connections between the HBFET 2400 and the RPU array 600 according to one or more embodiments of the present invention;

FIG. 36 depicts a cross-sectional view of a vertical HBFET structure during the fabrication according to one or more embodiments of the present invention to connect the HBFET 2400 to the RPU array 600;

FIG. 39 depicts an effect of the tunnel FET structure described herein on the current level according to one or more embodiments of the present invention;

FIG. 40 depicts an effect of the energy barrier in the tunnel FET structure described herein on the current level according to one or more embodiments of the present invention;

Figure 1:
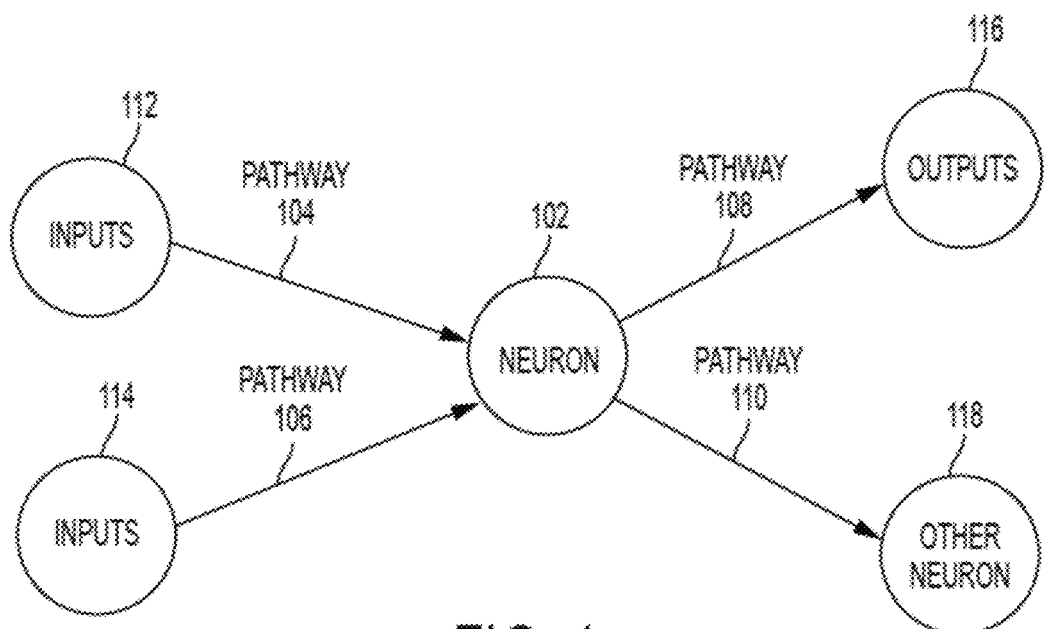
FIG. 1 depicts a simplified diagram of input and output connections of a biological neuron.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two, three, or four digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, in contemporary semiconductor device fabrication processes, a large number of semiconductor devices, such as field effect transistors (FETs), are fabricated on a single wafer. Further, some non-planar transistor architectures, such as vertical field effect transistors (VFETs), employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

There are challenges, however, in providing VFETs with equal or superior performance characteristics to lateral devices. In a VFET the contact to the bottom source/drain (S/D) is formed from the top of the structure such that the bottom S/D contact overlaps the gate. This vertically stacked configuration in combination with the reduced footprint of VFETs results in a large parasitic capacitance between the gate and the S/D region of the substrate. Parasitic capacitance between two conductors (also known as conductor-to-conductor capacitance) is a function of the length and thickness of the conductors as well as the distance separating the conductors. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Unfortunately, parasitic capacitance continues to increase as device dimensions and component spacing shrinks to meet increasing demands for smaller electronic devices. Conventional approaches to reducing the parasitic capacitance between the gate and the S/D region of the VFET substrate have not been wholly successful. In a conventional VFET, for example, a thin bottom spacer is formed between the gate and the bottom S/D region to somewhat mitigate the parasitic capacitance. The thickness of this thin bottom spacer in conventional VFETs, however, is constrained by channel length requirements. Consequently, the parasitic capacitance remains relatively high, and better solutions are needed.

Turning now to an overview of aspects of the present invention, one or more embodiments of the invention provide methods and structures configured to provide a FETs with controllable resistance. Such FETs improve systems, such as electronic circuits and devices that are used to implement artificial neural networks (ANN). Particularly, a technical challenge in implementing ANNs is the learning speed requirement for deep neural network application (described further). The aspects of the present invention provide technical solutions that address such technical challenges by facilitating an analog weight update component that satisfies the learning speed requirement.

Further, a brief description of ANN implementations using resistive processing unit (RPU) arrays is provided. The aspects of the present invention facilitate providing semiconductor devices that can be used in such ANN implementations, for example, to store weights at crosspoints of the RPU array. It should be noted that the semiconductor devices described herein can be used in ways other than the above example(s).

It is understood in advance that although one or more embodiments of the invention are described in the context of biological neural networks with a specific emphasis on modeling brain structures and functions, implementation of the teachings recited herein are not limited to modeling a particular environment. Rather, embodiments of the present invention are capable of modeling any type of environment, including for example, weather patterns, arbitrary data collected from the internet, and the like, as long as the various inputs to the environment can be turned into a vector. Accordingly, although embodiments of the present invention are directed to electronic systems, for ease of reference and explanation various aspects of the electronic systems are described using neurological terminology such as neurons, plasticity and synapses, for example. It will be understood that for any discussion or illustration herein of an electronic system, the use of neurological terminology or neurological shorthand notations are for ease of reference and are meant to cover the neuromorphic, ANN equivalent(s) of the described neurological function or neurological component.

Artificial neural networks (ANNs) can be used to estimate or approximate systems and functions that depend on a large number of inputs and are generally unknown. Neural networks use a class of algorithms based on a concept of interconnected "neurons." In a typical neural network, neurons have a given activation function that operates on the inputs. By determining proper connection weights (a process also referred to as "training"), a neural network achieves efficient recognition of a desired patterns, such as images and characters. Oftentimes, these neurons are grouped into "layers" in order to make connections between groups more obvious and to each computation of values. Training the neural network is a computationally intense process.

ANNs are often embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

Crossbar arrays, also known as crosspoint arrays or crosswire arrays, are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which can be formed from thin film material.

Crosspoint devices, in effect, function as the ANN's weighted connections between neurons. Nanoscale devices, for example memristors having "ideal" conduction state switching characteristics, are often used as the crosspoint devices in order to emulate synaptic plasticity with high energy efficiency. The conduction state (e.g., resistance) of the ideal memristor material can be altered by controlling the voltages applied between individual wires of the row and column wires. Digital data can be stored by alteration of the memristor material's conduction state at the intersection to achieve a high conduction state or a low conduction state. The memristor material can also be programmed to maintain two or more distinct conduction states by selectively setting the conduction state of the material. The conduction state of the memristor material can be read by applying a voltage across the material and measuring the current that passes through the target crosspoint device.

In order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Notwithstanding the potential for lower power consumption, executing offline training can be difficult and resource intensive because it is typically necessary during training to modify a significant number of adjustable parameters (e.g., weights) in the ANN model to match the input-output pairs for the training data. Accordingly, simplifying the crosspoint devices of ANN architectures to prioritize power-saving, offline learning techniques typically means that training speed and training efficiency are not optimized.

Instead of utilizing the traditional digital model of manipulating zeros and ones, ANNs create connections between processing elements that are substantially the functional equivalent of the core system functionality that is being estimated or approximated. For example, IBM™'s SYNAPSE™ computer chip is the central component of an electronic neuromorphic machine that attempts to provide similar form, function and architecture to the mammalian brain. Although the IBM SyNapse computer chip uses the same basic transistor components as conventional computer chips, its transistors are configured to mimic the behavior of neurons and their synapse connections. The IBM SyNapse computer chip processes information using a network of just over one million simulated "neurons," which communicate with one another using electrical spikes similar to the synaptic communications between biological neurons. The IBM SyNapse architecture includes a configuration of processors (i.e., simulated "neurons") that read a memory (i.e., a simulated "synapse") and perform simple operations. The communications between these processors, which are typically located in different cores, are performed by on-chip network routers.

Figure 2:
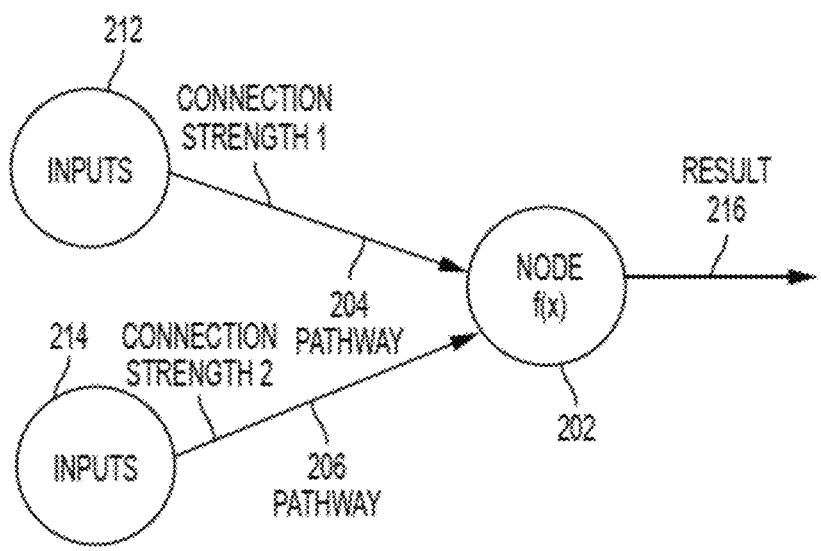
FIG. 2 depicts a known simplified model of the biological neuron shown in FIG. 1.
Figure 3:
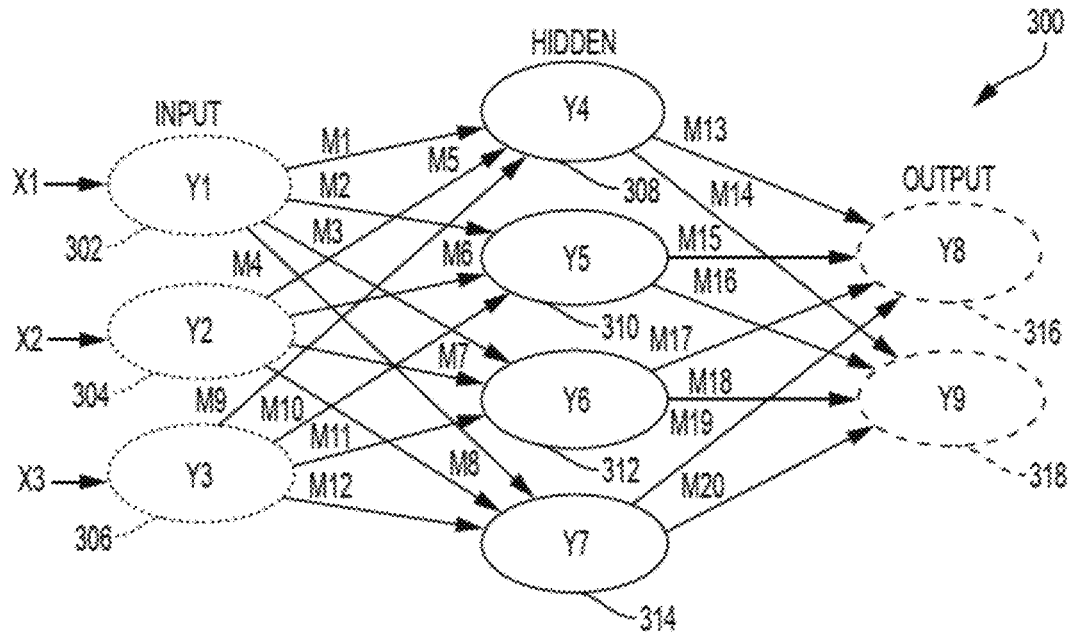
FIG. 3 depicts a known simplified model of an ANN incorporating the biological neuron model shown in FIG. 2.

A general description of how a typical ANN operates will now be provided with reference to FIGS. 1, 2 and 3. As previously noted herein, a typical ANN models the human brain, which includes about one hundred billion interconnected cells called neurons. FIG. 1 depicts a simplified diagram of a biological neuron 102 having pathways 104, 106, 108, 110 that connect it to upstream inputs 112, 114, downstream outputs 116 and downstream "other" neurons 118, configured and arranged as shown. Each biological neuron 102 sends and receives electrical impulses through pathways 104, 106, 108, 110. The nature of these electrical impulses and how they are processed in biological neuron 102 are primarily responsible for overall brain functionality. The pathway connections between biological neurons can be strong or weak. When a given neuron receives input impulses, the neuron processes the input according to the neuron's function and sends the result of the function to downstream outputs and/or downstream "other" neurons.

Biological neuron 102 is modeled in FIG. 2 as a node 202 having a mathematical function, f(x) depicted by the equation shown in FIG. 2. Node 202 takes electrical signals from inputs 212, 214, multiplies each input 212, 214 by the strength of its respective connection pathway 204, 206, takes a sum of the inputs, passes the sum through a function, f(x), and generates a result 216, which can be a final output or an input to another node, or both. In the present description, an asterisk (*) is used to represent a multiplication. Weak input signals are multiplied by a very small connection strength number, so the impact of a weak input signal on the function is very low. Similarly, strong input signals are multiplied by a higher connection strength number, so the impact of a strong input signal on the function is larger. The function f(x) is a design choice, and a variety of functions can be used. An example design choice for f(x) is the hyperbolic tangent function, which takes the function of the previous sum and outputs a number between minus one and plus one.

FIG. 3 depicts a simplified ANN model 300 organized as a weighted directional graph, wherein the artificial neurons are nodes (e.g., 302, 308, 316), and wherein weighted directed edges (e.g., m1 to m20) connect the nodes. ANN model 300 is organized such that nodes 302, 304, 306 are input layer nodes, nodes 308, 310, 312, 314 are hidden layer nodes and nodes 316, 318 are output layer nodes. Each node is connected to every node in the adjacent layer by connection pathways, which are depicted in FIG. 3 as directional arrows having connection strengths m1 to m20. Although only one input layer, one hidden layer and one output layer are shown, in practice, multiple input layers, hidden layers and output layers can be provided.

Similar to the functionality of a human brain, each input layer node 302, 304, 306 of ANN 300 receives inputs x1, x2, x3 directly from a source (not shown) with no connection strength adjustments and no node summations. Accordingly, y1=f(x1), y2=f(x2) and y3=f(x3), as shown by the equations listed at the bottom of FIG. 3. Each hidden layer node 308, 310, 312, 314 receives its inputs from all input layer nodes 302, 304, 306 according to the connection strengths associated with the relevant connection pathways. Thus, in hidden layer node 308, y4=f(m1*y1+m5*y2+m9*y3), wherein * represents a multiplication. A similar connection strength multiplication and node summation is performed for hidden layer nodes 310, 312, 314 and output layer nodes 316, 318, as shown by the equations defining functions y5 to y9 depicted at the bottom of FIG. 3.

ANN model 300 processes data records one at a time, and it "learns" by comparing an initially arbitrary classification of the record with the known actual classification of the record. Using a training methodology knows as "backpropagation" (i.e., "backward propagation of errors"), the errors from the initial classification of the first record are fed back into the network and used to modify the network's weighted connections the second time around, and this feedback process continues for many iterations. In the training phase of an ANN, the correct classification for each record is known, and the output nodes can therefore be assigned "correct" values. For example, a node value of "1" (or 0.9) for the node corresponding to the correct class, and a node value of "0" (or 0.1) for the others. It is thus possible to compare the network's calculated values for the output nodes to these "correct" values, and to calculate an error term for each node (i.e., the "delta" rule). These error terms are then used to adjust the weights in the hidden layers so that in the next iteration the output values will be closer to the "correct" values.

There are many types of neural networks, but the two broadest categories are feed-forward and feedback/recurrent networks. ANN model 300 is a non-recurrent feed-forward network having inputs, outputs and hidden layers. The signals can only travel in one direction. Input data is passed onto a layer of processing elements that perform calculations. Each processing element makes its computation based upon a weighted sum of its inputs. The new calculated values then become the new input values that feed the next layer. This process continues until it has gone through all the layers and determined the output. A threshold transfer function is sometimes used to quantify the output of a neuron in the output layer.

A feedback/recurrent network includes feedback paths, which mean that the signals can travel in both directions using loops. All possible connections between nodes are allowed. Because loops are present in this type of network, under certain operations, it can become a non-linear dynamical system that changes continuously until it reaches a state of equilibrium. Feedback networks are often used in associative memories and optimization problems, wherein the network looks for the best arrangement of interconnected factors.

The speed and efficiency of machine learning in feed-forward and recurrent ANN architectures depend on how effectively the crosspoint devices of the ANN crossbar array perform the core operations of typical machine learning algorithms. Although a precise definition of machine learning is difficult to formulate, a learning process in the ANN context can be viewed as the problem of updating the crosspoint device connection weights so that a network can efficiently perform a specific task. The crosspoint devices typically learn the necessary connection weights from available training patterns. Performance is improved over time by iteratively updating the weights in the network. Instead of following a set of rules specified by human experts, ANNs "learn" underlying rules (like input-output relationships) from the given collection of representative examples. Accordingly, a learning algorithm can be generally defined as the procedure by which learning rules are used to update and/or adjust the relevant weights.

The three main learning algorithm paradigms are supervised, unsupervised and hybrid. In supervised learning, or learning with a "teacher," the network is provided with a correct answer (output) for every input pattern. Weights are determined to allow the network to produce answers as close as possible to the known correct answers. Reinforcement learning is a variant of supervised learning in which the network is provided with only a critique on the correctness of network outputs, not the correct answers themselves. In contrast, unsupervised learning, or learning without a teacher, does not require a correct answer associated with each input pattern in the training data set. It explores the underlying structure in the data, or correlations between patterns in the data, and organizes patterns into categories from these correlations. Hybrid learning combines supervised and unsupervised learning. Parts of the weights are usually determined through supervised learning, while the others are obtained through unsupervised learning.

As previously noted herein, in order to limit power consumption, the crosspoint devices of ANN chip architectures are often designed to utilize offline learning techniques, wherein the approximation of the target function does not change once the initial training phase has been resolved. Offline learning allows the crosspoint devices of crossbar-type ANN architectures to be simplified such that they draw very little power.

Figure 4:
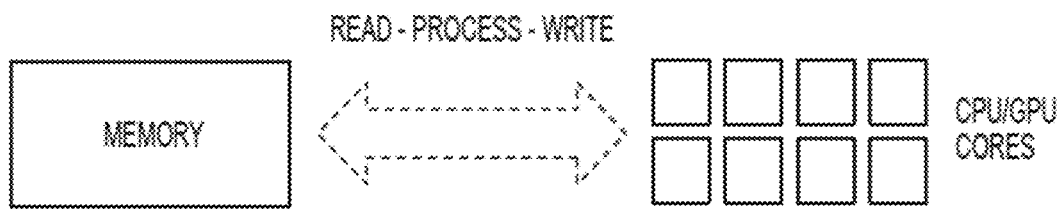
FIG. 4 depicts a simplified block diagram of a known weight update methodology.

Notwithstanding the potential for lower power consumption, executing offline training can be difficult and resource intensive because it is typically necessary during training to modify a significant number of adjustable parameters (e.g., weights) in the ANN model to match the input-output pairs for the training data. FIG. 4 depicts a simplified illustration of a typical read-process-write weight update operation, wherein CPU/GPU cores (i.e., simulated "neurons") read a memory (i.e., a simulated "synapse") and perform weight update processing operations, then write the updated weights back to memory. Accordingly, simplifying the crosspoint devices of ANN architectures to prioritize power-saving, offline learning techniques typically means that training speed and training efficiency are not optimized.

Figure 5:
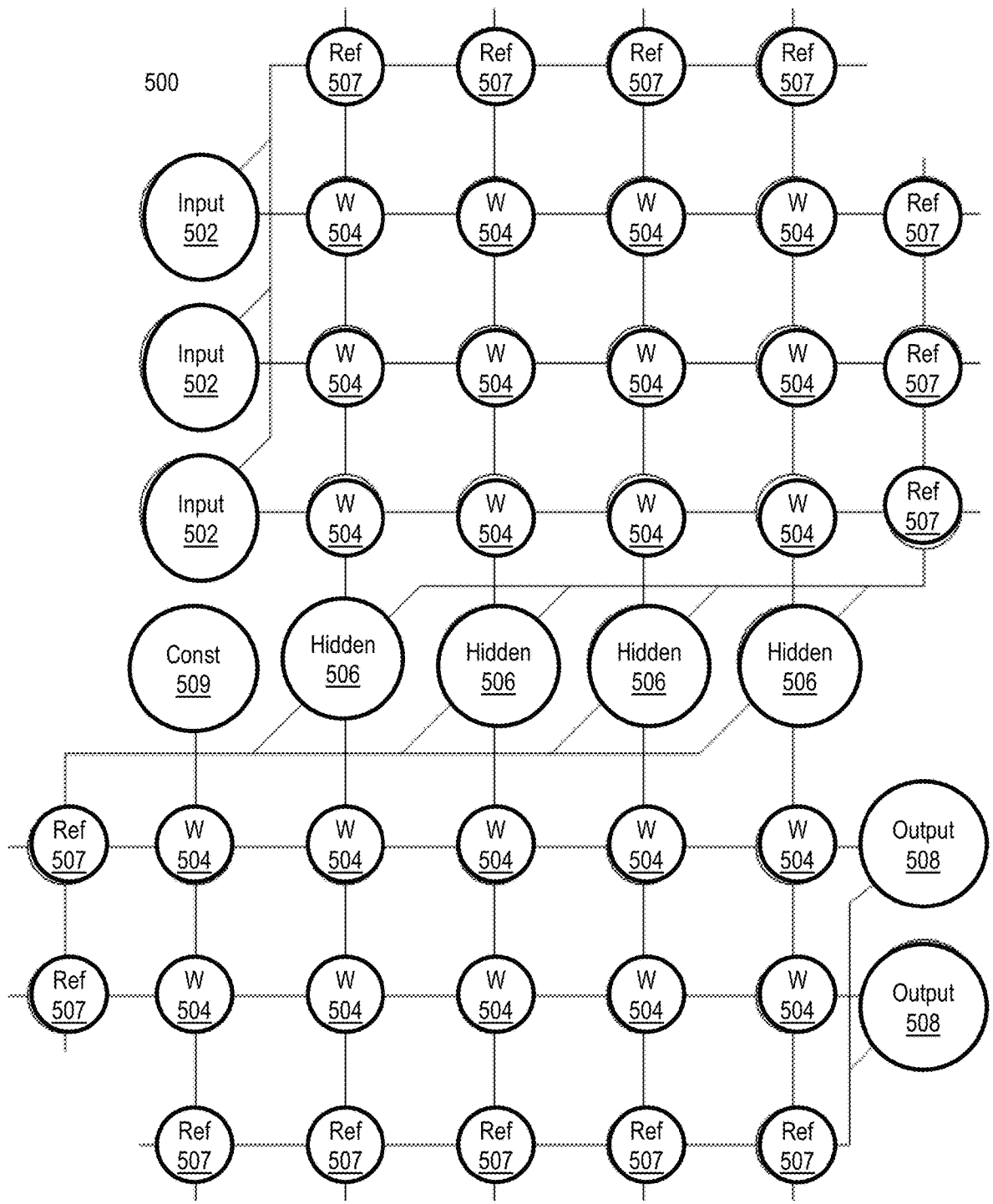
FIG. 5 is a diagram of an ANN including arrays of weights in accordance with the one or more embodiments.

FIG. 5 illustrates an artificial neural network (ANN) architecture 500. During feed-forward operation, a set of input neurons 502 each provide an input voltage in parallel to a respective row of weights 504. A weight 504 is a crosspoint device, such as an RPU. The weights 504 each have a settable resistance value, such that a current output flows from the weight 504 to a respective hidden neuron 506 to represent the weighted input. The current output by a given weight is determined as I=V/r, where V is the input voltage from the input neuron 502 and r is the set resistance of the weight 504. The current from each weight adds column-wise and flows to a hidden neuron 506. A set of reference weights 507 have a fixed resistance and combine their outputs into a reference current that is provided to each of the hidden neurons 506. Because conductance values can only be positive numbers, some reference conductance is needed to encode both positive and negative values in the matrix. The currents produced by the weights 504 are continuously valued and positive, and therefore the reference weights 507 are used to provide a reference current, above which currents are considered to have positive values and below which currents are considered to have negative values. By facilitating the resistance value (r) of FETs to be controllable, and controllable above a predetermined threshold (e.g. 10 M$\Omega$, 90 M$\Omega$, 99 M$\Omega$, 100 M$\Omega$ etc.) the technical solutions described herein facilitate using the FETs as the weight storage component at a crosspoint in the RPU array. Alternatively, a capacitor at each crosspoint stores the weight and the FET facilitates reading the value from the capacitor.

The hidden neurons 506 use the currents from the array of weights 504 and the reference weights 507 to perform some calculation. The hidden neurons 506 then output a voltage of their own to another array of weights 507. This array performs in the same way, with a column of weights 504 receiving a voltage from their respective hidden neuron 506 to produce a weighted current output that adds row-wise and is provided to the output neuron 508.

It should be understood that any number of these stages can be implemented, by interposing additional layers of arrays and hidden neurons 506. It should also be noted that some neurons can be constant neurons 509, which provide a constant voltage to the array. The constant neurons 509 can be present among the input neurons 502 and/or hidden neurons 506 and are only used during feed-forward operation.

During back propagation, the output neurons 508 provide a voltage back across the array of weights 504. The output layer compares the generated network response to training data and computes an error. The error is applied to the array as a voltage pulse, where the height and/or duration of the pulse is modulated proportional to the error value. In this example, a row of weights 504 receives a voltage from a respective output neuron 508 in parallel and converts that voltage into a current which adds column-wise to provide an input to hidden neurons 506. The hidden neurons 506 provide combine the weighted feedback signal with a derivative of its feed-forward calculation and stores an error value before outputting a feedback signal voltage to its respective column of weights 504. This back propagation travels through the entire network 500 until all hidden neurons 506 and the input neurons 502 have stored an error value.

During weight updates, the input neurons 502 and hidden neurons 506 apply a first weight update voltage forward and the output neurons 508 and hidden neurons 506 apply a second weight update voltage backward through the network 500. The combinations of these voltages create a state change within each weight 504, causing the weight 504 to take on a new resistance value. In this manner, the weights 504 can be trained to adapt the neural network 500 to errors in its processing. It should be noted that the three modes of operation, feed forward, back propagation, and weight update, do not overlap with one another.

As previously noted herein, to accommodate the learning speed requirement for deep neural network application, the embodiments of the present invention provide an analog weight update component. For example, Resistive processing unit (RPU) in a cross-bar structure can enable parallel matrix multiplication and improve the neural network training speed. For large neural networks which usually contains >1 million weight elements, each weight element is to be highly resistive, in the order of 10 M$\Omega$, and the resistance needs to be changeable. Field Effect transistor (FET), whose resistance can be well controlled by gate potential, is a candidate as a weight element for implementing such a neural network. However, the resistance of modern FETs is in the range of 10 k$\Omega$, therefore, it has to be increased ~1000 times to meet the specification. The embodiments of the present invention address such technical challenges and provide FET structures that meet such specifications, thus facilitating implementation of the neural networks using RPU cross-bar structures.

Turning now to an overview of the present invention, one or more embodiments are directed to a programmable resistive crosspoint component referred to herein as a crosspoint device, or a resistive processing unit (RPU), which provides local data storage functionality and local data processing functionality. In other words, when performing data processing, the value stored at each RPU is updated in parallel and locally, which eliminate the need to move relevant data in and out of a processor and a separate storage element. Additionally, the local data storage and local data processing provided by the described RPUs accelerate the ANN's ability to implement algorithms such as matrix multiplication and the like. Accordingly, implementing a machine learning ANN architecture having the described RPU enables the implementation that optimize the speed, efficiency and power consumption of the ANN. The described RPU and resulting ANN architecture improve overall ANN performance and enable a broader range of practical ANN applications.

The RPU in the cross-bar structure enables parallel matrix multiplication and substantially enhances the neural network training speed. For large neural networks which usually contain more than 1 million weight elements, each weight element has to be highly resistive, in the order of 10 M$\Omega$, and the resistance has to be changeable. For example, FETs, whose resistance can be well controlled by gate potential, is one candidate as a weight element for the neural network. However, the resistance of modern FET is in the range of 10 k$\Omega$, substantially lower than what is required for implementing the large neural networks (almost 1000 times lower to meet the specifications). Such technical challenges are addressed by the invention(s) described herein by facilitating weight storage elements that have an increased controllable resistance in the substantially higher ranges, such as 10 M$\Omega$-100 M$\Omega$.

In one or more examples, two charge transport changes in the FET structure substantially increase the controllable resistance of a FET, enabling the FET to be used as the weight storage element in an RPU array.

Figure 6:
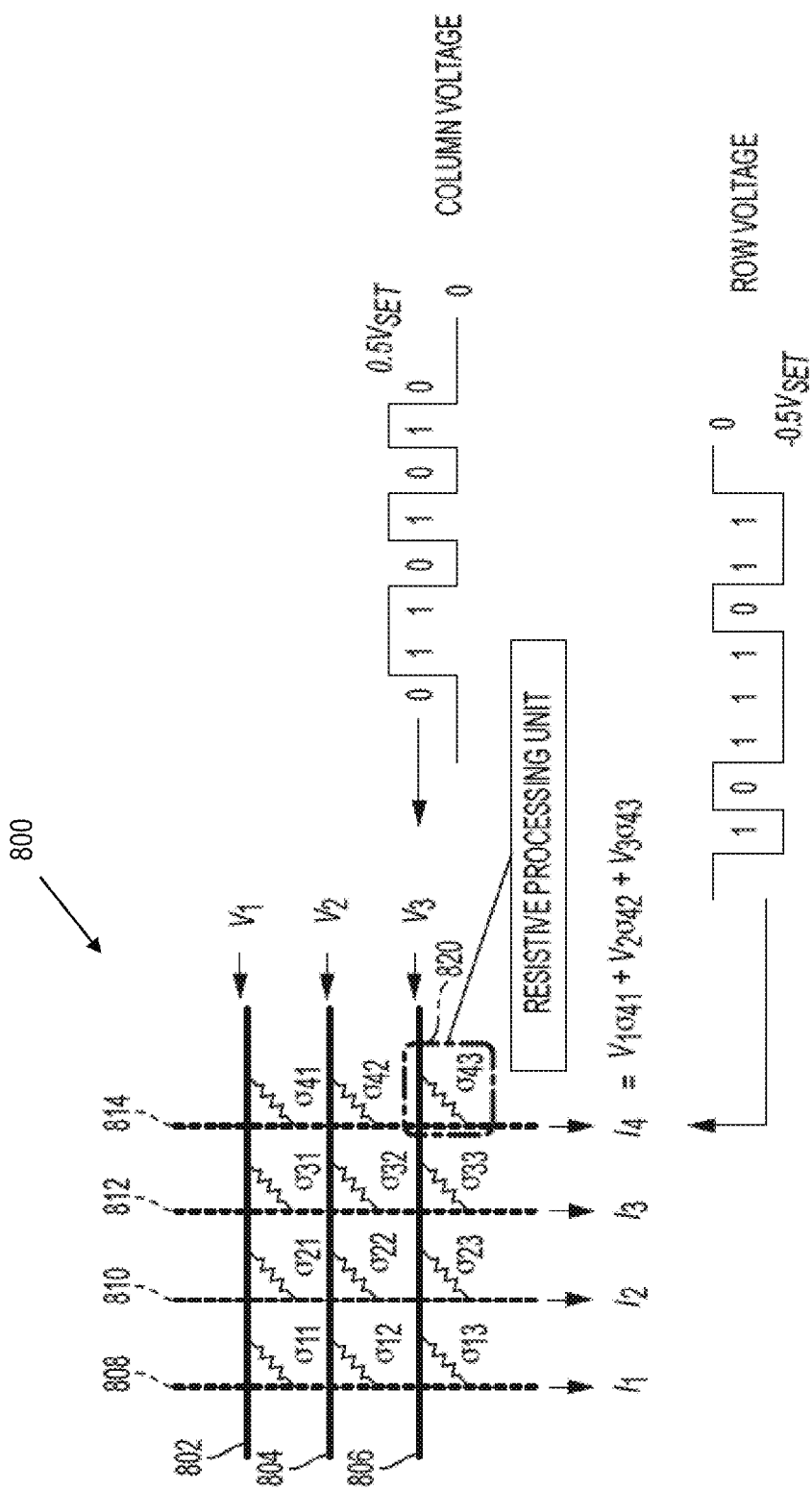
FIG. 6 depicts a cross bar array of RPU devices according to embodiments of the present invention, along with voltage sequences illustrating the operation of the RPU.

FIG. 6 depicts a cross bar array of RPU devices according to embodiments of the present invention, along with voltage sequences illustrating the operation of the RPU. FIG. 6 is a diagram of a two-dimensional (2D) crossbar array 600 that performs forward matrix multiplication, backward matrix multiplication and weight updates according to embodiments of the present invention. Crossbar array 600 is formed from a set of conductive row wires 802, 804, 806 and a set of conductive column wires 808, 810, 812, and 814 that intersect the set of conductive row wires 802, 804, and 806. The intersections between the set of row wires and the set of column wires are separated by RPUs, which are shown in FIG. 6 as resistive elements each having its own adjustable/updateable resistive weight, depicted as $\sigma_{11}$, $\sigma_{21}$, $\sigma_{31}$, $\sigma_{41}$, $\sigma_{12}$, $\sigma_{22}$, $\sigma_{32}$, $\sigma_{42}$, $\sigma_{13}$, $\sigma_{23}$, $\sigma_{33}$ and $\sigma_{43}$, respectively. For ease of illustration, only one RPU 820 is labeled with a reference number in FIG. 6. In forward matrix multiplication, the conduction state (i.e., the stored weights) of the RPU can be read by applying a voltage across the RPU and measuring the current that passes through the RPU.

Input voltages V1, V2, V3 are applied to row wires 802, 804, 806, respectively. Each column wire 808, 810, 812, 814 sums the currents I1, I2, I3, I4 generated by each RPU along the particular column wire. For example, as shown in FIG. 6, the current I4 generated by column wire 814 is according to the equation $I4=V1\sigma_{41}+V2\sigma_{42}+V3\sigma_{43}$. Thus, array 600 computes the forward matrix multiplication by multiplying the values stored in the RPUs by the row wire inputs, which are defined by voltages V1, V2, V3. The backward matrix multiplication is very similar. In backward matrix multiplication, voltages are applied at column wires 808, 810, 812, 814 then read from row wires 802, 804, 806. For weight updates, which are described in greater detail below, voltages are applied to column wires and row wires at the same time, and the conductance values stored in the relevant RPU devices all update in parallel. Accordingly, the multiplication and addition operations required to perform weight updates are performed locally at each RPU 820 of array 600 using the RPU device itself plus the relevant row or column wire of array 600.

Continuing with the diagram of FIG. 6, in accordance with one or more embodiments, the operation of a positive weight update methodology for RPU 820 and its corresponding weight $\sigma_{33}$ at the intersection of conductive row wire 806 and conductive column wire 812 will now be provided. Update generator circuitry (not shown) is provided at the periphery of crossbar array 600 and used as a peripheral "translator" in order to generate necessary voltage pulses in the form of stochastic bit streams that are applied to all RPUs of 2D crossbar array 600.

Accordingly, referring to the ANN implemented using a crosspoint array including RPUs as described herein, in the array, the value of the resistance (or conductance) of each node determines the coupling between nodes, where a node is represented by an RPU device in the array. Further, upon training the crosspoint array according to the ANN, the resistance (or conductance) will be different from device to device, depending on the desired coupling. For training a neural network, it is necessary to actively adjust the resistance values. Once the training is complete, the resistance values remain fixed during operation of the crosspoint array circuit, until training begins for a new task.

Methods for forming a semiconductor device and semiconductor devices in accordance with embodiments of the invention are described in detail below by referring to the accompanying drawings.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop. The term "about" is intended to include the degree of error associated with measurement of the particular quantity based upon the equipment available at the time of filing the application. For example, "about" can include a range of ±8% or 5%, or 2% of a given value.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having closely packed vertical transistors with reduced contact resistance according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. A wet etch process, such as a buffered hydrofluoric acid (BHF) etch, is a material removal process that uses liquid chemicals or etchants to remove materials from a surface. A dry etch process, such as reactive ion etching (RIE), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

In one or more embodiments, the resistive elements are formed using semiconductor strips, such as polysilicon. The strips can be doped, to control the resistivity of the semiconductor. Typically, the resistance value can be varied using strips of different dimensions. However, the conventional method can include tailoring multiple lithographic masks to ensure that contacts are made with the ends of the strips.

Turning now to an overview of aspects of the present invention, one or more embodiments provide methods of fabricating a semiconductor device having a crosspoint array that includes multiple crosspoint devices with controllable high resistance values (>10 MΩ). In one or more embodiments, optical lithography and/or electron beam lithography is used followed by selective plasma etching for fabricating the crosspoint array that includes multiple crosspoint devices.

Figure 7:
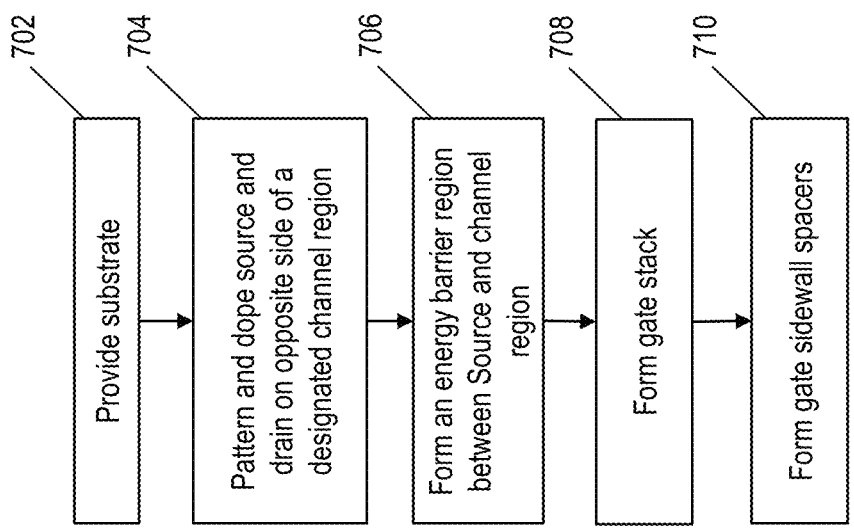
FIG. 7 depicts a flowchart for an example method of fabricating a planar diffusion FET 700 according to one or more embodiments of the present invention.

FIG. 7 depicts a flowchart for an example method of fabricating a planar diffusion FET according to one or more embodiments of the present invention. The method includes providing a substrate 805, such as a silicon-on-insulator (SOI) wafer or any other semiconductor substrate (702).

FIG. 8 depicts a cross sectional view of an example wafer 805 used to fabricate a semiconductor device 800 according to one or more examples, the wafer 800 is lightly doped. In case of wafer 800 is an SOI, it can further include an insulator layer (e.g., a buried oxide (BOX) layer or other suitable insulator layer) on the substrate 805.

Referring back to FIG. 7, the fabrication method for the planar FET further includes, patterning a source region 825 and a channel region 827 for an FET structure in the substrate 805 (704).

FIG. 9 depicts an example FET structure according to one or more embodiments of the present invention. The FET structure includes shallow trench isolation (STI) regions 820 to define a device region within the semiconductor layer 805. In one or more examples patterning and doping process is performed that to form the source and drain regions 825 and 827. Between the source and drain region would be the designated channel region 850. The patterning process is performed by optical lithography and the doping process by ion implementation and high temperature annealing.

Further, the fabrication method (FIG. 7) includes forming an energy barrier region 830 (706).

Figure 10:
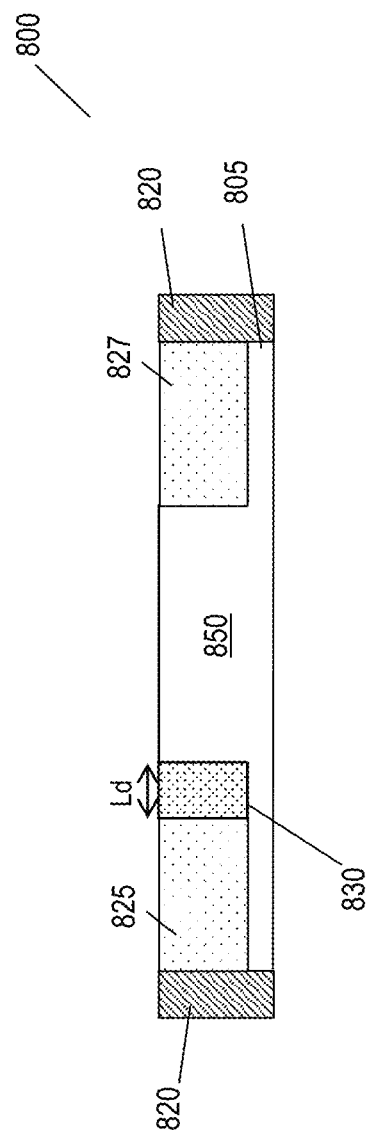
FIG. 10 depicts an example FET structure according to one or more embodiments of the present invention subsequent to forming the source/drain and energy barrier.

FIG. 10 depicts an example FET structure according to one or more embodiments of the present invention subsequent to forming the energy barrier 830. In addition to the source 825 and the drain 827, the energy barrier 830 is added between the source 825 and channel 850 by patterning and partially doping the channel 850. The energy barrier 830 is created in a region between the source 825 (or drain 827) and the channel 850 for the predetermined size Ld.

The energy barrier 830 is created by heavier doping of the region of the energy barrier 830 compared to the doping performed on the channel 850. For example, in case of ion implantation, the energy barrier 830 is doped heavier (P+) than the channel 850 (P−), and the source 825 and the drain 827 are N doped, thus forming an N-P-N FET. In other embodiments, a P-N-P FET is fabricated by implanting ions to dope the energy barrier 830 heavier (N+) compared to the channel 850 (N−), and implanting the source 825 and the drain 827 to be doped (P).

The doped regions (825, 827, and 830) can be formed in the substrate 805 by a variety of methods, such as, implantation and plasma doping. In one or more examples, they may be etched away and regrown with different methods, for example, in-situ doped epitaxy, doped following the epitaxy, and the like. The doped regions can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, the doped regions include epitaxial semiconductor materials grown from gaseous or liquid precursors.

Figure 11:
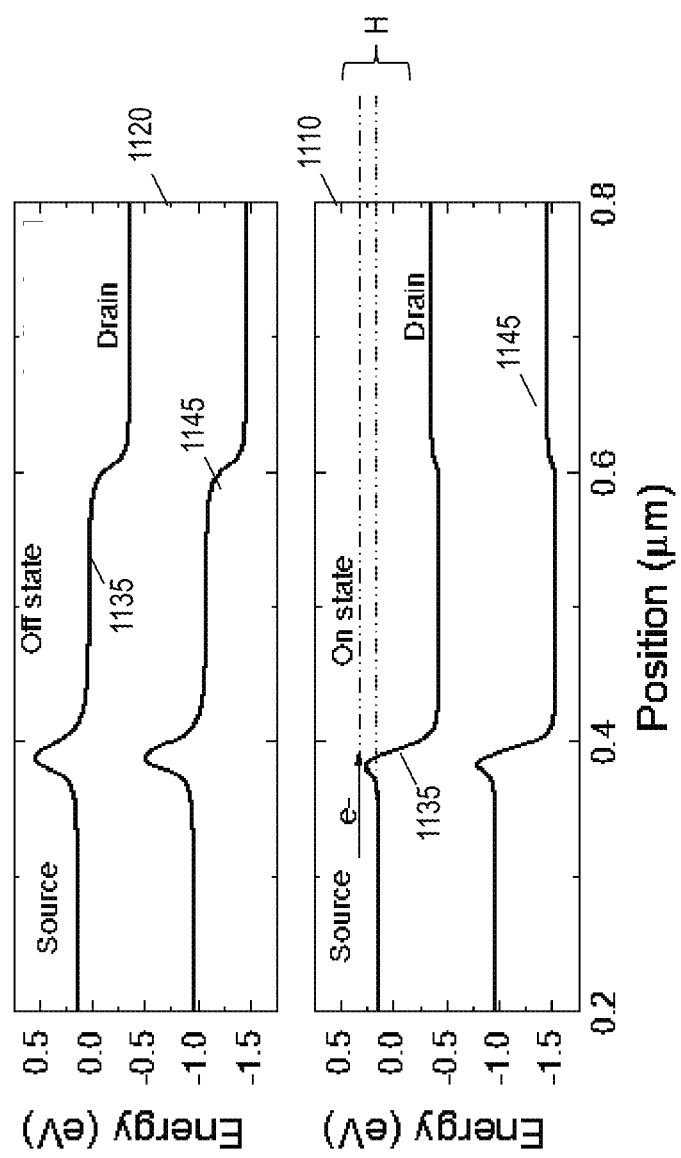
FIG. 11 depicts an effect of the energy barrier in the FET structure described herein on the current level according to one or more embodiments of the present invention.

FIG. 11 depicts an effect of the energy barrier in the FET structure described herein on the current level according to one or more embodiments of the present invention. Plot 1110 depicts an ON state of a diffusion FET and plot 1120 depicts an OFF state. In both plots, a valence band 1135 and a conduction band 1145 are shown. Typically, in a diffusion FET, the "ON" state current is dominated by the diffusion current from the source 825 to the drain 827, via the channel 850. In the FET structure described herein, the current level is dominated by the energy barrier height (labeled H) between the source 825 and the extra doping region 830. This barrier height can be modulated by the gate voltage through the sidewall spacer. The spacer is an insulating layer, preferable to be high-k dielectric. Charge on the gate generates fringing field in the spacer, through which modulates the height of the energy barrier.

Figure 12:
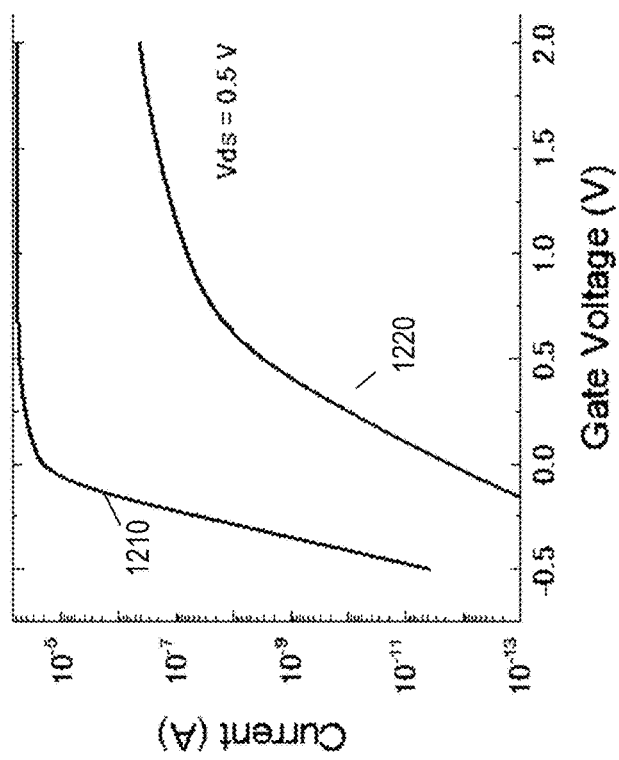
FIG. 12 depicts an effect of the energy barrier in the FET structure described herein on the current level according to one or more embodiments of the present invention.

FIG. 12 depicts an effect of the energy barrier in the FET structure described herein on the current level according to one or more embodiments of the present invention. The illustrated plot shows a comparison of a first transfer characteristic 1210 of a typical FET, without the energy barrier 830, and a second transfer characteristic 1220 of a diffusion FET with the energy barrier 830. As can be seen the diffusion FET with the energy barrier 830 has a lower current. It should be noted that the plots in FIG. 12 illustrate result values from specific example scenario, and that in other examples, the plots can be different from those illustrated.

Figure 13:
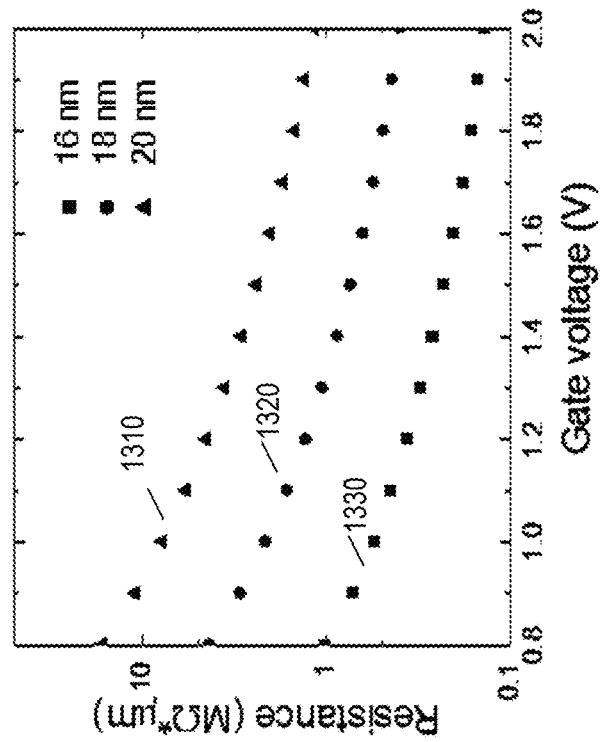
FIG. 13 depicts an effect of the energy barrier in the FET structure described herein on the current level according to one or more embodiments of the present invention.

FIG. 13 depicts an effect of the energy barrier in the FET structure described herein on the current level according to one or more embodiments of the present invention. The illustrated plot shows resistance of the diffusion FET with the energy barrier 830 as a function of gate voltage with different lengths (Ld) of the energy barrier region 830 with the extra doping. For example, the plot depicts the resistance of the FET as Ld is set at 16 nm (1330), 18 nm (1320), and 20 nm (1310), respectively. It should be noted that the value of Ld can be different from the above exemplary values, causing the FET resistance to change in a different manner than what is shown in FIG. 13.

Referring back to FIG. 7, the fabrication method for the planar FET further includes, conventional processing in order to form a gate stack 840 (708).

Figure 14:
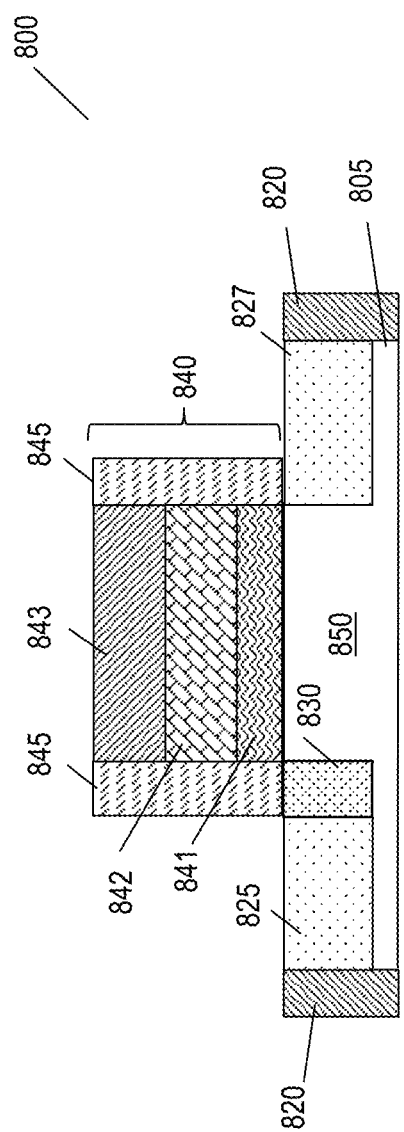
FIG. 14 depicts an example FET structure according to one or more embodiments of the present invention subsequent to forming the gate stack.

FIG. 14 depicts an example FET structure according to one or more embodiments of the present invention subsequent to forming the gate stack. The FET structure further includes a gate stack 840 (e.g., a gate dielectric layer 841, a gate conductor layer 842 on the gate dielectric layer 841 and a cap layer 843, such as a nitride cap layer, on the gate conductor layer 842) over the designated channel region 850 within the device region. Typically, the gate dielectric layer is an oxide of silicon, but any material suitable for use as a gate dielectric can be used. Examples of other gate dielectric materials include $HfO_2$ and $Al_2O_3$. The gate conductor layer 842 can be composed of metal and/or polysilicon or any other material(s) that serves as the gate electrode for the semiconductor device 800.

Further, gate sidewall spacers 845 are formed on opposing sides of the gate stack 840 (710). In one or more examples, source/drain extension regions and/or halo regions can also be formed, depending upon the integration scheme (e.g., late or early). The details of the above-mentioned conventional processing are well-known and are omitted to allow the reader to focus on the salient aspects of the embodiments described herein.

Further, in order to store the weight in the FET 800, the gate potential of the FET device 800 is kept at a certain value. This can be realized through different structures.

Figure 15:
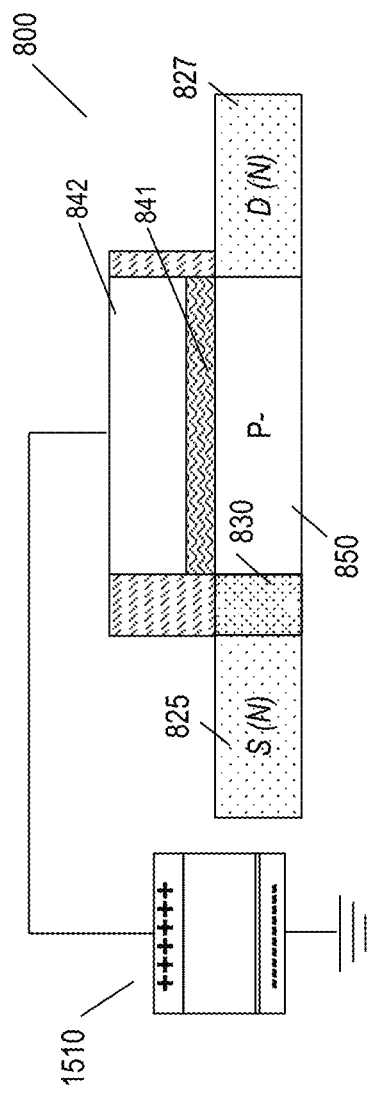
FIG. 15 depicts an embodiment to store the weight in the FET 800 according to one or more embodiments of the present invention.

FIG. 15 depicts an embodiment to store the weight in the FET 800 according to one or more embodiments of the present invention. The FET 800 is connected with a capacitor 1510. The charge is stored at the plate to provide the gate voltage, the charge stored being representative of the weight stored at the crosspoint in the RPU array 600. It should be noted that only some of the parts of the FET device 800 are shown in FIG. 15 for simplicity of illustration.

Figure 16:
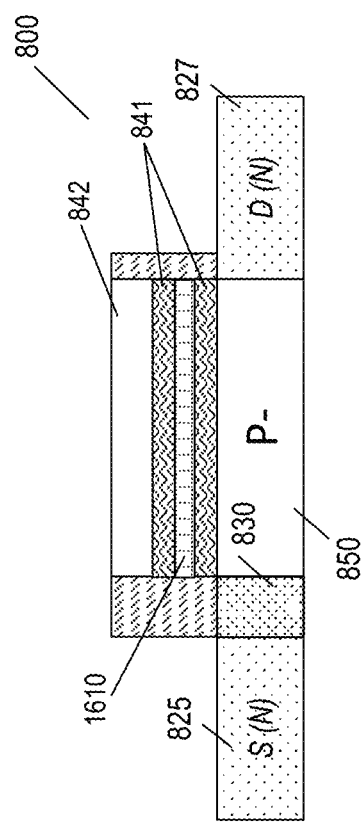
FIG. 16 depicts an embodiment to store the weight in the FET 800 according to one or more embodiments of the present invention.

FIG. 16 depicts an embodiment to store the weight in the FET 800 according to one or more embodiments of the present invention. A charge storage layer 1610, such as a floating gate is added to the gate stack 840. The charge can be stored in the charge storing layer 1610 to provide the gate voltage. The charge storing layer 1610 is composed of polysilicon. In one or more examples, another the gate dielectric layer 841 is added after the charge storing layer 1610, followed by the further layers in the gate stack 840, such as the conductive material layer 842 for the electrode.

Figure 17:
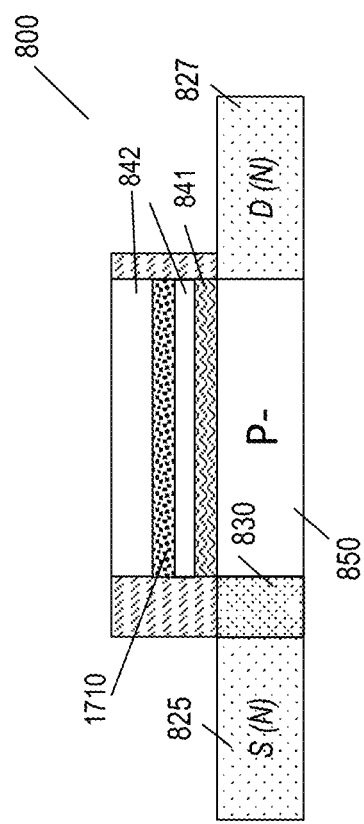
FIG. 17 depicts another embodiment to store the weight in the FET 800 according to one or more embodiments of the present invention.

FIG. 17 depicts another embodiment to store the weight in the FET 800 according to one or more embodiments of the present invention. Here, the gate stack includes the gate dielectric layer 841 followed by a first conductive material layer 842. A ferroelectric material layer 1710 is added subsequently, such as composed of hafnium dioxide (HfO2). The polarization of the ferroelectric layer 1710 induces electrical field in the spacer to modulate the height of energy barrier in layer 830. Further, the gate stack 840 includes a second conductive material layer 842 to form the control gate electrode. The first conductive material layer 842 addresses a technical challenge of depolarization of the ferroelelectric material layer 1710.

Further, in one or more examples, the energy barrier 830 between the source 825 and the channel 850 is modulated in an indirect way, through the side wall 845 dielectrics. For example, the side walls 845 can be composed of hafnium dioxide (HfO2) and titanium nitride (TiN) depositions are used to form a high-k dielectric layer. The ferroelectric layer 1710 and the side walls 845 thus form a metal high dielectric constant (MHK) gate stack.

Thus, the one or more planar diffusion FET semiconductor devices described herein provide technical solutions to the technical challenges of providing controllable resistance, particularly above 10 MΩ. Such planar diffusion FETs can be used in crosspoint devices that are part of an RPU array 600 that performs matrix multiplications, such as for implementing ANNs.

Figure 18:
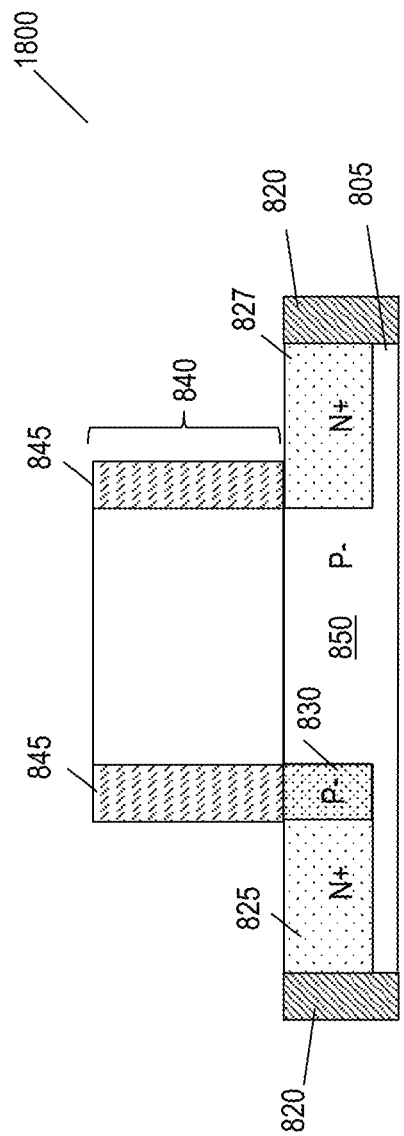
FIG. 18 depicts an example semiconductor structure for the FET according to one or more embodiments of the present invention.

Further, according to one or more embodiments of the present invention, the semiconductor FET is a hetero-barrier FET (HBFET), for example, with a (III-V structure). FIG. 18 depicts an example semiconductor structure for the FET according to one or more embodiments of the present invention. The hetero-barrier FET (III-V) structure 1800 (as shown) is similar to the diffusion-FET described earlier, but instead of using a doped region as the energy barrier region 830 near source, the hetero-barrier FET incorporates a heterojunction material.

For example, in the HBFET 1800 the source 825, drain 827, and channel 850 are composed of a III-V small bandgap channel such as indium gallium arsenide (InGaAs) or gallium arsenide antimonide (GaAsSb) to improve complementary metal oxide semiconductor (CMOS) transistor switching speed. Further, the energy barrier 830 is composed of a wide-bandgap material, such as indium phosphide (InP) to form a hetero-barrier. The HBFET 1800 further includes the gate stack 840 with side walls composed of spacer material such as Si3N4 that facilitates hetero-barrier modulation thru fringe-fields. In one or more examples, the regions are doped to form a NPN HBFET such that—the source 825 and drain 827 are doped N+, and the energy barrier 830 and the channel 850 are doped P−. It should be noted that in other examples the doping can be different to form a PNP HBFET.

Figure 19:
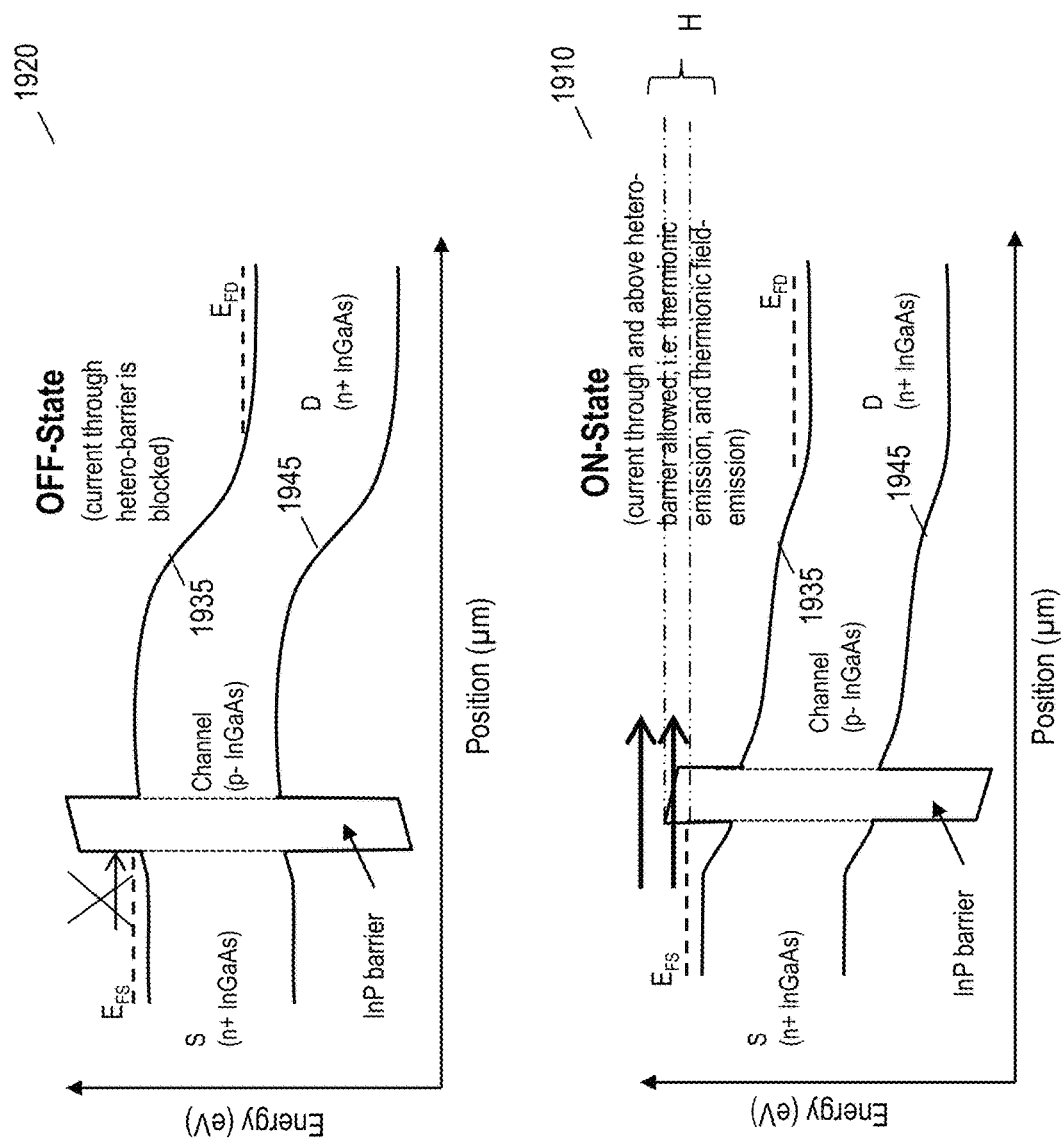
FIG. 19 depicts an effect of the energy barrier in the III-V HBFET structure 1800 described herein on the current level according to one or more embodiments of the present invention.

FIG. 19 depicts an effect of the energy barrier in the III-V HBFET structure 1800 described herein on the current level according to one or more embodiments of the present invention. Plot 1910 depicts an ON state of the HBFET and plot 1920 depicts an OFF state of the HBFET. In both plots, a valence band 1935 and a conduction band 1945 are shown. Typically, in a diffusion FET, the "ON" state current is dominated by the diffusion current from the source 825 to the drain 827, via the channel 850. In the HBFET structure described herein, the current level is dominated by the hetero-barrier energy barrier height (labeled H) between the source 825 and the energy barrier region 830. This barrier height can be modulated by the gate voltage through the sidewall spacer.

According to one or more embodiments of the present invention, the HBFET 1800 is a Si—SiGe structure with, the source 825, drain 827, and channel 850 are composed of a strained silicon germanium (SiGe) or germanium (Ge). Further, the energy barrier 830 is composed of Si. The HBFET 1800 further includes the gate stack 840 with side walls composed of spacer material such as Si3N4. In one or more examples, the regions are doped to form a NPN HBFET such that—the source 825 and drain 827 are doped N+, and the energy barrier 830 and the channel 850 are doped P−. It should be noted that in other examples the doping can be different to form a PNP HBFET.

Figure 20:
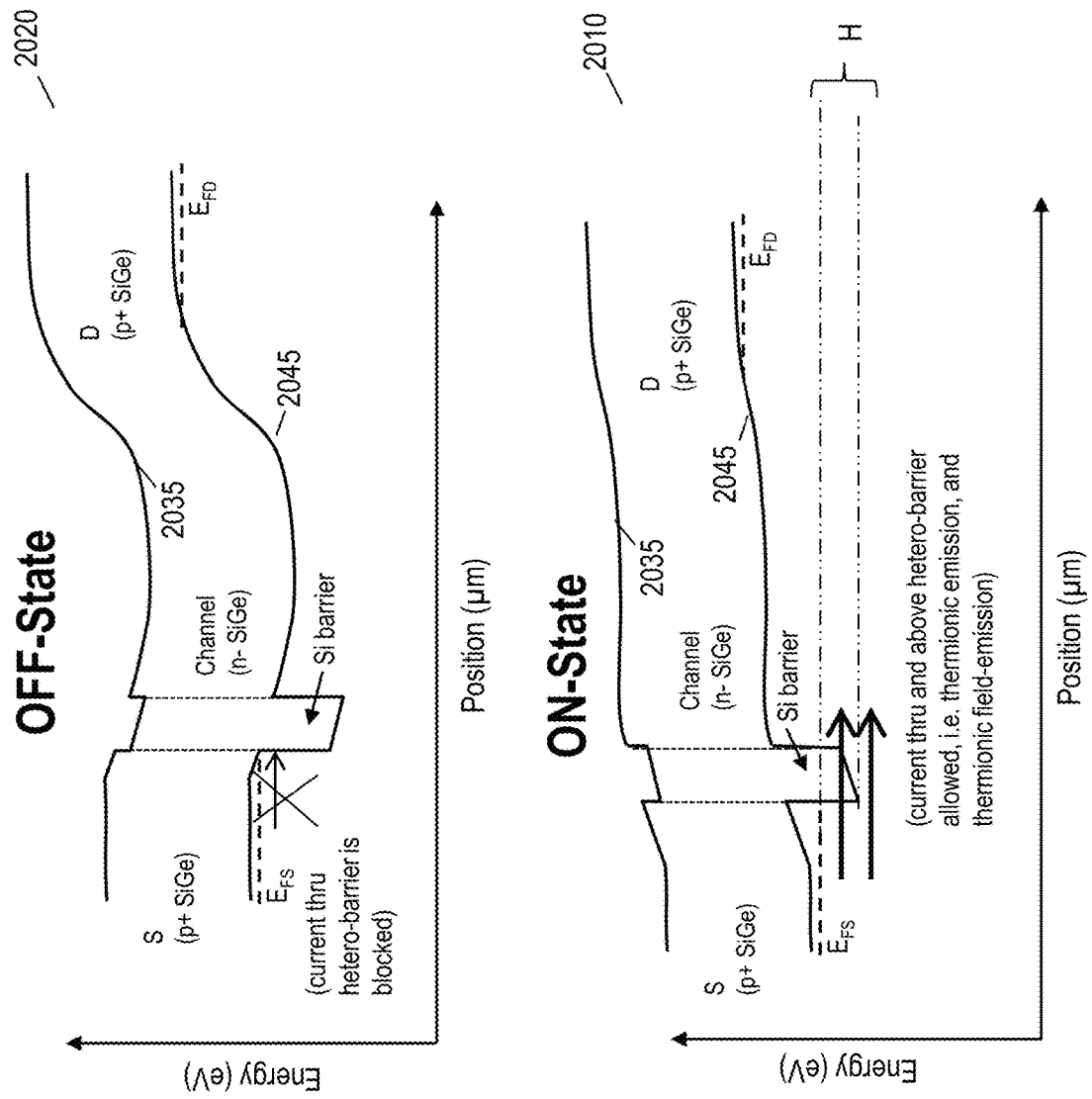
FIG. 20 depicts an effect of the energy barrier in the SiGe—Si HBFET structure 1800 described herein on the current level according to one or more embodiments of the present invention.

FIG. 20 depicts an effect of the energy barrier in the SiGe—Si HBFET structure 1800 described herein on the current level according to one or more embodiments of the present invention. Plot 2010 depicts an ON state of the HBFET and plot 2020 depicts an OFF state of the HBFET. In both plots, a valence band 2035 and a conduction band 2045 are shown. Typically, in a diffusion FET, the "ON" state current is dominated by the diffusion current from the source 825 to the drain 827, via the channel 850. In the HBFET structure described herein, the current level is dominated by the hetero-barrier energy barrier height (labeled H) between the source 825 and the energy barrier region 830. This barrier height can be modulated by the gate voltage.

Further, in order to store the weight in the HBFET 1800, the gate potential of the HBFET device 1800 is kept at a certain value. This can be realized through different structures.

FIG. 21 depicts an embodiment to store the weight in the HBFET 1800 according to one or more embodiments of the present invention. The HBFET 1800 is connected with a capacitor 1510. The charge is stored at the plate to provide the gate voltage, the charge stored being representative of the weight stored at the crosspoint in the RPU array 600. It should be noted that only some of the parts of the HBFET device 1800 are shown in FIG. 21 for simplicity of illustration.

FIG. 22 depicts an embodiment to store the weight in the HBFET 1800 according to one or more embodiments of the present invention. A charge storage layer 1610, such as a floating gate is added to the gate stack 840. The charge can be stored in the charge storing layer 1610 to provide the gate voltage. The charge storing layer 1610 is composed of polysilicon. In one or more examples, another the gate dielectric layer 841 is added after the charge storing layer 1610, followed by the further layers in the gate stack 840, such as the conductive material layer 842 for the electrode.

Figure 23:
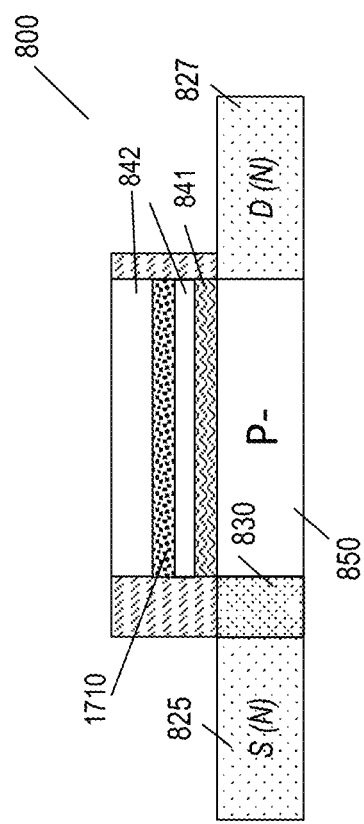
FIG. 23 depicts another embodiment to store the weight in the HBFET 1800 according to one or more embodiments of the present invention.

FIG. 23 depicts another embodiment to store the weight in the HBFET 1800 according to one or more embodiments of the present invention. Here, the gate stack includes the gate dielectric layer 841 followed by a first conductive material layer 842. A ferroelelectric material layer 1710 is added subsequently, such as composed of hafnium dioxide (HfO2). The polarization of the ferroelectric layer 1710 induces electrical field in the sidewall spacer to modulate the energy barrier height of layer 830. Further, the gate stack 840 includes a second conductive material layer 842 to form the control gate electrode. The first conductive material layer 842 addresses a technical challenge of depolarization of the ferroelectric material layer 1710.

Further, in one or more examples, the energy barrier 830 between the source 825 and the channel 850 is modulated in an indirect way, through the side wall 845 dielectrics. For example, the side walls 845 can be composed of hafnium dioxide (HfO2) and titanium nitride (TiN) depositions are used to form a high-k dielectric layer. The ferroelectric layer 1710 and the side walls 845 thus form a metal high dielectric constant (MHK) gate stack.

Thus, the one or more planar HBFET semiconductor devices described herein provide technical solutions to the technical challenges of providing controllable resistance, particularly above 10 MΩ. Such planar HBFETs can be used in crosspoint devices that are part of an RPU array 600 that performs matrix multiplications, such as for implementing ANNs.

Figure 24:
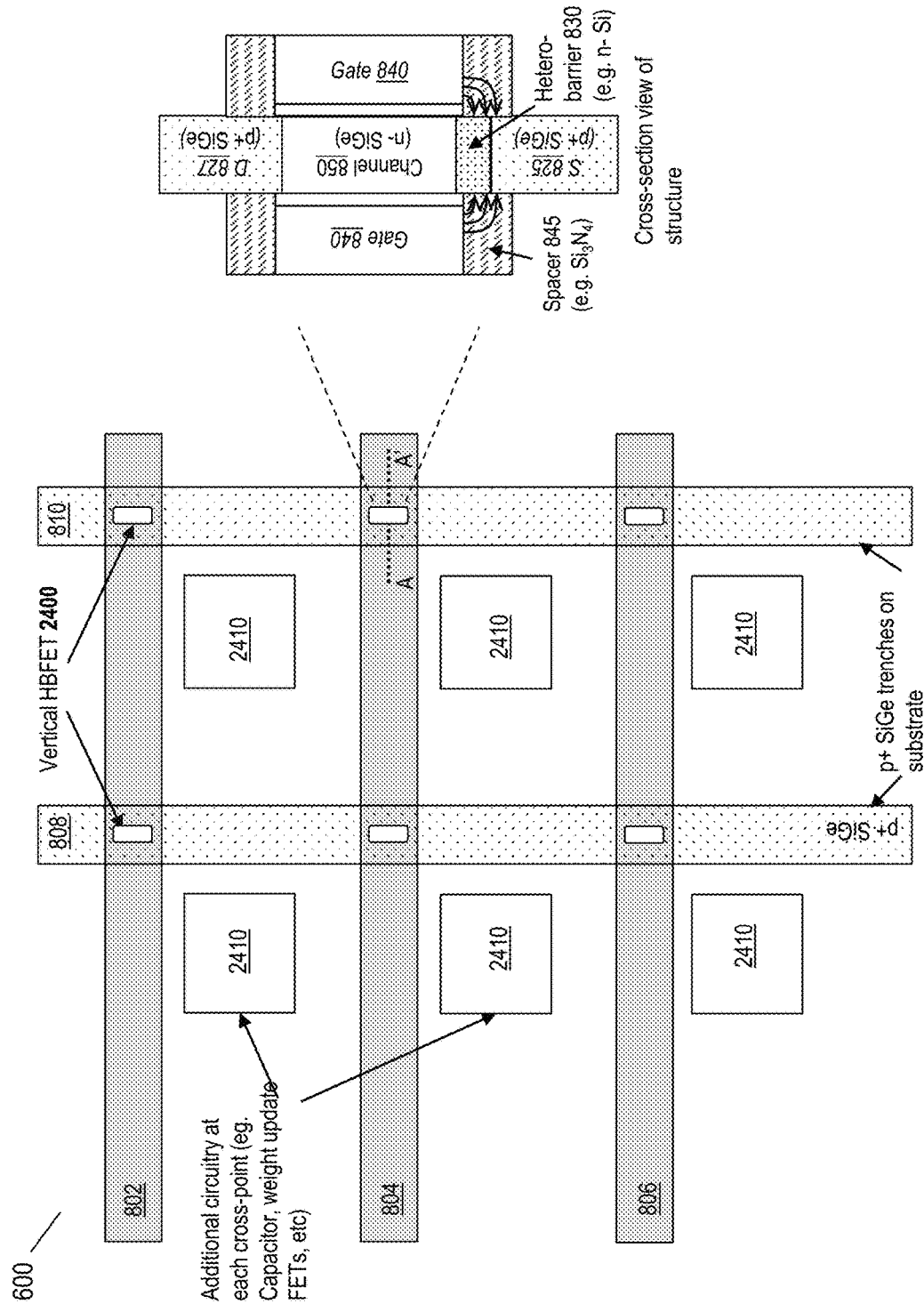
FIG. 24 depicts an example RPU array 600 using vertical semiconductor structure for the HBFET according to one or more embodiments of the present invention.

Further, according to one or more embodiments of the present invention, the semiconductor HBFET can be a vertical HBFET. FIG. 24 depicts an example RPU array 600 using vertical semiconductor structure for the HBFET according to one or more embodiments of the present invention. The RPU array 600 includes the vertical HBFET 2400 at each crosspoint along with additional circuitry at each cross-point (e.g. capacitor, weight update FETs, etc.). A cross-section view of the vertical HBFET 2400 is shown along an axis A-A'. The vertical HBFET 2400 can include the energy barrier 830 according to the one or more embodiments described herein (III-V, or SiGe—Si, or any other).

Herein, 802, 804, 806 are the top metal wires (row-wires) that contact the top device terminals (drain 827 in this case). The bottom contact (source 825) is formed by the semiconductor layers grown on the substrate creating the active semiconductor regions 808, 810 (column-wise). Furthermore, the vertical HBFET 2400 retains the various semiconductor layer stack as shown by the process steps in FIGS. 25-36. On the other hand, remaining region of 808, 810 outside of the HBFET 2400 is etched down to p+ SiGe layer 2530 thus forming the common bottom conductor (column-wise) to HBFETs in regions 808, 810 (not shown).

The fabrication of the vertical HBFET 2400 in the RPU array 600 is described further. The various illustrations used for the description of the fabrication method further uses cross-sectional views for each step along the A-A' axis. The fabrication process is described for the Si—SiGe based structure, however a person skilled in the art can use the description for fabricating other types of the vertical HBFET as described herein.

Figure 25:
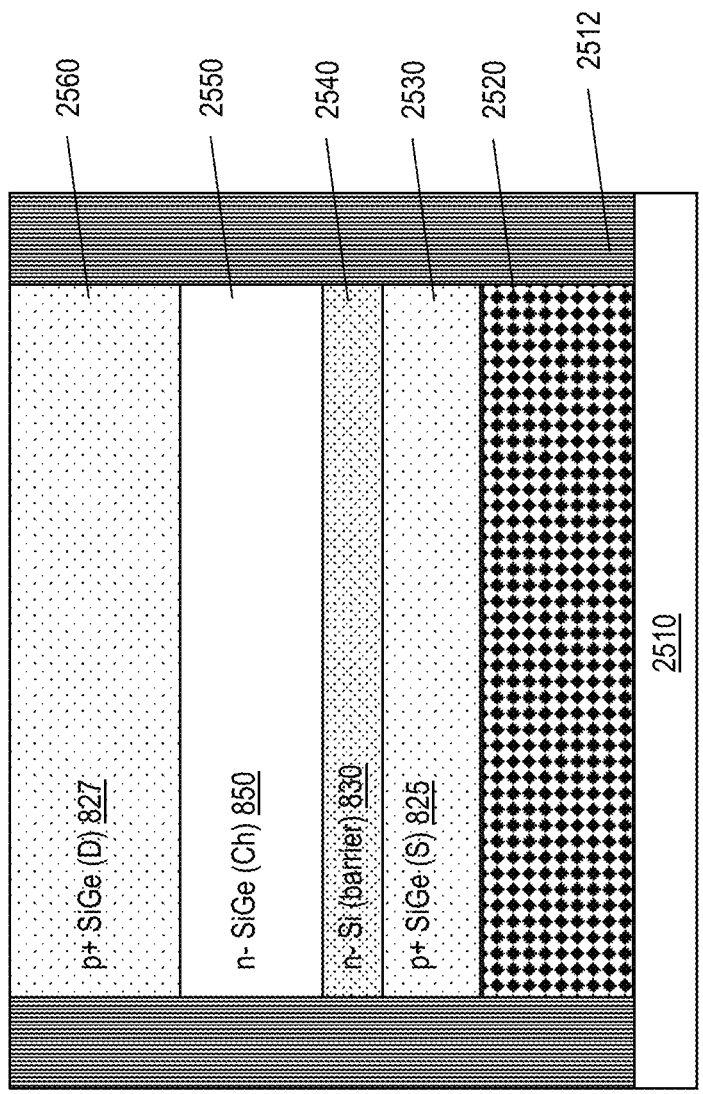
FIG. 25 depicts a substrate preparation of the HBFET 2400 area according to one or more embodiments of the present invention.

FIG. 25 depicts a substrate preparation of the HBFET 2400 area according to one or more embodiments of the present invention (in particular, with regard to FIG. 20). Initially, an HBFET region (for example, opening device region in STI) is defined on the substrate 2510. The substrate 2510 can be any suitable substrate material, such as, for example, SiC, or semiconductor-on-insulator (SOI), or the like. In some embodiments, the substrate 2510 includes a buried oxide layer (not depicted). The semiconductor active region can be electrically isolated from other regions of the substrate 2510 by a shallow trench isolation (STI) 2512. The STI 2512 can be of any suitable dielectric material, such as, for example, a silicon oxide. Any known manner of forming the device to device isolation 2512 can be utilized. In some embodiments, the STI 2512 is formed by first depositing the dielectric material (2512) over the entire substrate and then opening the active semiconductor area 808, 810 using an etch process which is then followed by the growth of additional semiconductor layers 2520, 2530, 2540, 2550, 2560 within the aforementioned opening. In some embodiments, the STI 2512 is formed by first growing the different semiconductor layers 2520, 2530, 2540, 2550, 2560 over the entire substrate 2510 and then etching down to the substrate 2510 to form a trench, filling the trench with the STI 2512 material, and planarizing to a surface of the semiconductor layer 2560 using, for example, a CMP process.

Accordingly, a strain-relaxed-buffer (SRB) region 2520 is grown on the substrate 2510. Subsequently, a P+ SiGe (bottom source 825) 2530 is grown on the SRB region 2520. A growth of the n– Si (hetero-barrier 830) layer 2540 is further performed. Subsequently, an N– SiGe (channel 850) layer 2550 is grown. Further, a P+ SiGe (top drain 827) layer 2560 is grown. It should be noted that although the layers are depicted as source and drain, in other embodiments, the drain and source layers can be interchanged.

For example, the heavily doped region 2530 of the substrate can be a source or drain region formed in the substrate 2510 by a variety of methods, such as, for example, in-situ doped epitaxy, doped following the epitaxy, or by implantation and plasma doping. The heavily doped region 2530 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), and MBE. In some embodiments, the heavily doped region 2530 includes epitaxial semiconductor materials grown from gaseous or liquid precursors. In some embodiments, epitaxial regions are epitaxially grown over the substrate 2510. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al). The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions include silicon. In some embodiments, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Figure 26:
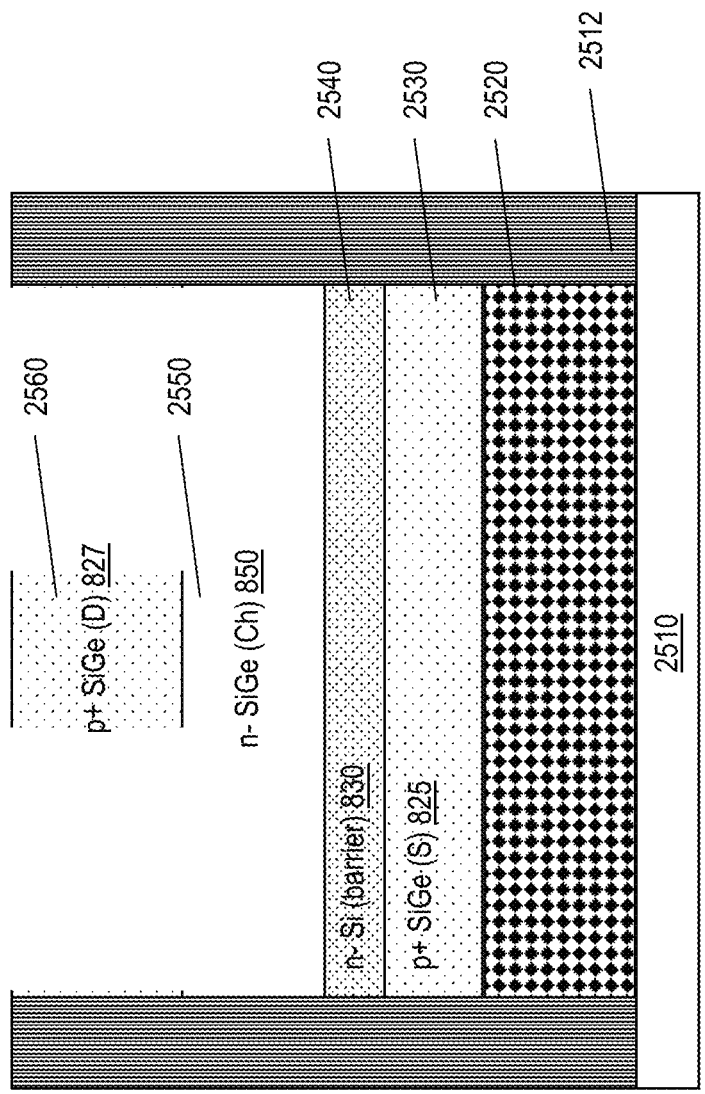
FIG. 26 depicts a subsequent intermediate structure of the HBFET 2400 during the fabrication according to one or more embodiments of the present invention.

FIG. 26 depicts a subsequent intermediate structure of the HBFET 2400 during the fabrication according to one or more embodiments of the present invention. In this step, using lithography techniques, a vertical etch is performed to etch SiGe layers 2550 and 2560 until the first Si layer 2540. A mask using a predetermined dimensions is used for performing the vertical etching to leave a drain and channel of predetermined dimensions.

For example, a hard mask is formed on a surface of each of the semiconductor fins. The hard mask can include an oxide, nitride, oxynitride or any combination thereof, including multilayers. In some embodiments, the hard mask can include silicon oxide or silicon nitride. The hard mask can be formed utilizing a deposition process such as, for example, chemical vapor deposition (CVD), plasma enhanced chemical vapor deposition (PECVD), chemical solution deposition, evaporation. In some embodiments, the hard mask can be formed by a thermal process such as, for example, oxidation or nitridation of the top semiconductor layer. Any combination of the above mentioned processes can also be used in forming the hard mask. The hard mask can have a thickness from 20 nm to 80 nm, for example, from 30 nm to 60 nm.

In some embodiments, the hard mask is formed prior to the semiconductor fins. The hard mask is then patterned and the pattern is transferred to the substrate 2510 to form the semiconductor fins using known lithographic processes. The lithographic step can include applying a photoresist layer (not depicted) atop the hard mask, exposing the photoresist layer to a desired pattern of radiation, and developing the exposed photoresist layer utilizing a resist developer. The etching process can include dry etching and/or wet chemical etching. Examples of dry etching processes that can be used include reactive ion etching (RIE), ion beam etching, plasma etching or laser ablation. The etching process can transfer the pattern from the patterned photoresist layer to the hard mask and to the substrate 2510. In some embodiments, a buried insulator layer (not depicted) serves as an etch stop. After forming the semiconductor fins, the patterned photoresist layer can be removed utilizing a resist stripping process such as, for example, ashing. In some embodiments, the semiconductor fins are formed utilizing a sidewall image transfer (SIT) process (not depicted). In an SIT process, spacers can be formed on a dummy mandrel. The dummy mandrel can be removed and the remaining spacers can be used as a hard mask to etch the top semiconductor layer. The spacers can then be removed after the semiconductor fins have been formed.

Figure 27:
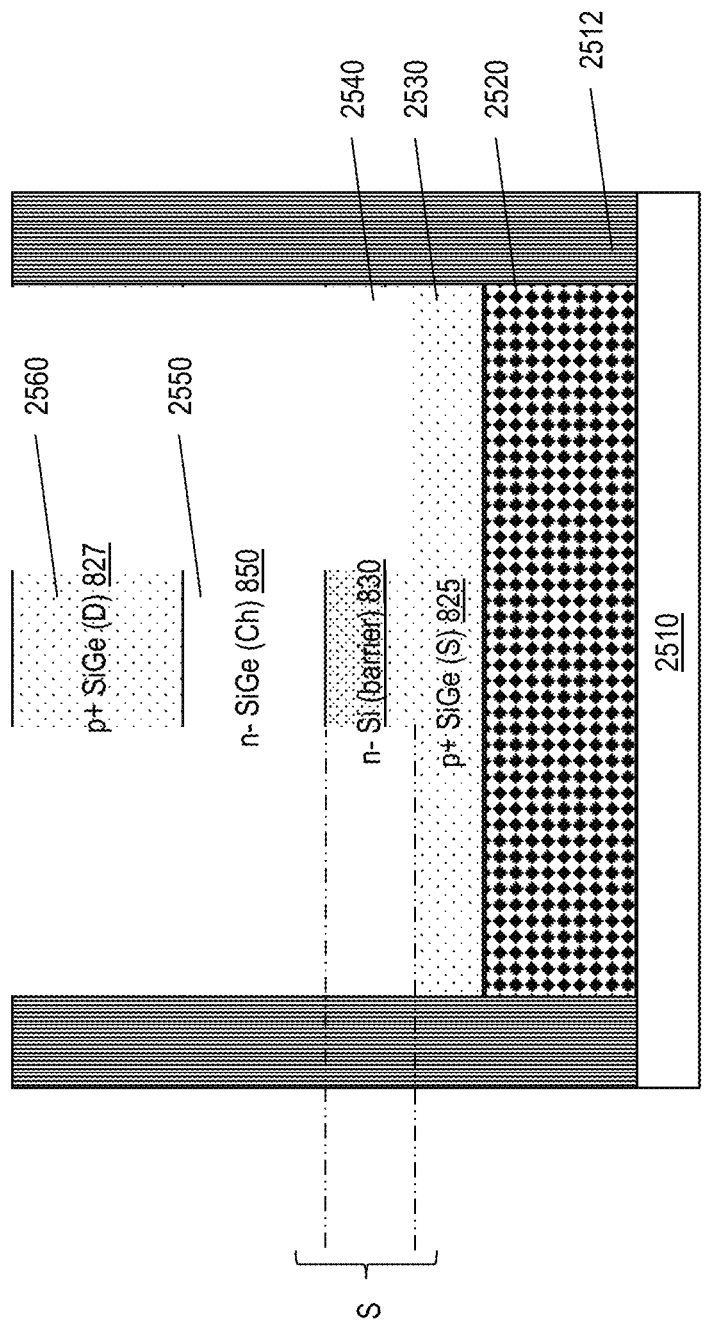
FIG. 27 depicts a subsequent intermediate structure of the HBFET 2400 during the fabrication according to one or more embodiments of the present invention.

FIG. 27 depicts a subsequent intermediate structure of the HBFET 2400 during the fabrication according to one or more embodiments of the present invention. In this step, using lithography techniques, a vertical etch is performed to etch Si layer 2540 down to SiGe layer 2530. Then a timed etching is performed on the SiGe layer 2530 of the source 825. The etching is performed for a predetermined duration of time, or to etch a predetermined depth S of the SiGe layer 2530. The etching is performed as described herein.

Figure 28:
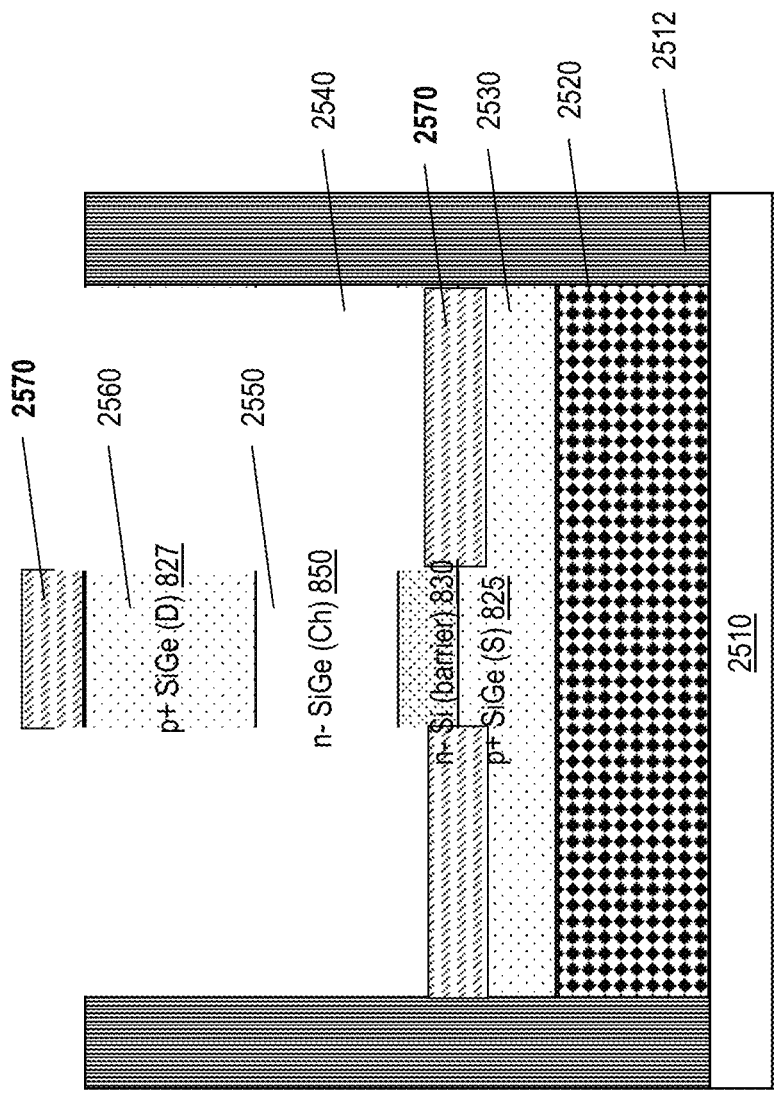
FIG. 28 depicts a subsequent intermediate structure of the HBFET 2400 during the fabrication according to one or more embodiments of the present invention.

FIG. 28 depicts a subsequent intermediate structure of the HBFET 2400 during the fabrication according to one or more embodiments of the present invention. In this step, material used to compose the sidewall spacers 845 of the gate stack 840 is deposited to form layer 2570. The layer 2570 is deposited in the vertically etched trenches on layer 2530 that forms the source 825 as well as on the layer 2560 that forms the drain 827. In one or more examples, an anisotropic etching is performed to have the spacer layer 2570 of a predetermined height above the layer 2530.

The first bottom spacer 2570 can include a dielectric material, such as silicon oxide, silicon nitride, silicon oxynitride, or a combination thereof, and can be formed using known deposition processes. In some embodiments, the first bottom spacer 2570 is formed by performing a directional deposition process such as, for example, a Gas Cluster Ion Beam (GCIB) process. The GCIB process is a deposition process that can be highly directional in nature. For example, the directional deposition process can result in the deposition of dielectric material on the horizontally oriented surfaces of the device, such as the upper surface of the hard mask and the substrate 2510, while avoiding deposition of any substantial amount of dielectric material on the vertically-oriented surfaces of the device, such as sidewalls of the semiconductor fins.

Figure 29:
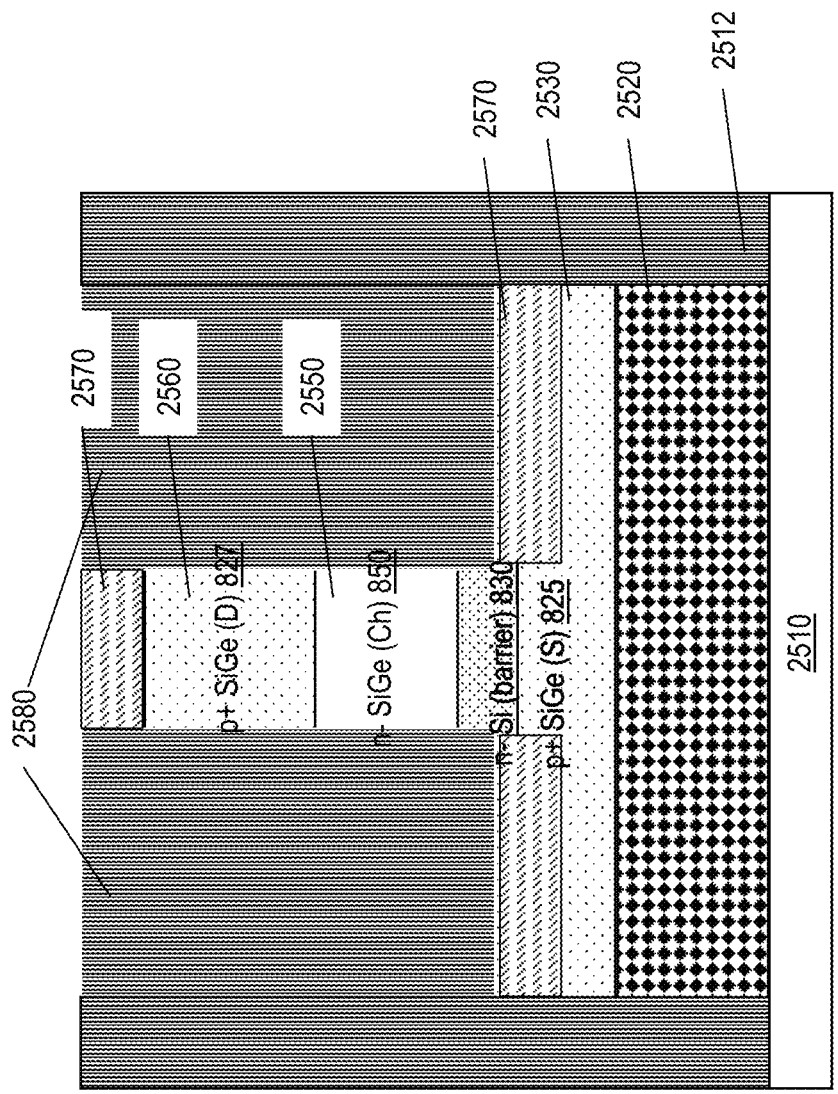
FIG. 29 depicts a subsequent intermediate structure of the HBFET 2400 during the fabrication according to one or more embodiments of the present invention.

FIG. 29 depicts a subsequent intermediate structure of the HBFET 2400 during the fabrication according to one or more embodiments of the present invention. In this step, a dielectric fill is performed to deposit an interlayer dielectric (ILD) material 2580 on exposed surfaces of the HBFET structure, for example, to fill regions between the semiconductor fins. The ILD 2580 can be any suitable dielectric material, such as, for example, a silicon oxide.

The ILD 2580 can be polished using, for example, CMP selective to the top spacer (for example, stop on nitride). The CMP process can be utilized to remove excess portions of ILD 2580 such that the upper surface of ILD 2580 is coplanar with the upper surface of the top spacer 2570. In some embodiments, the material of ILD 2580 is chosen such that portion of the top spacer 2570 and the hard mask can be removed selective to the ILD 2580 during a subsequent etching (as depicted in FIG. 30).

Figure 30:
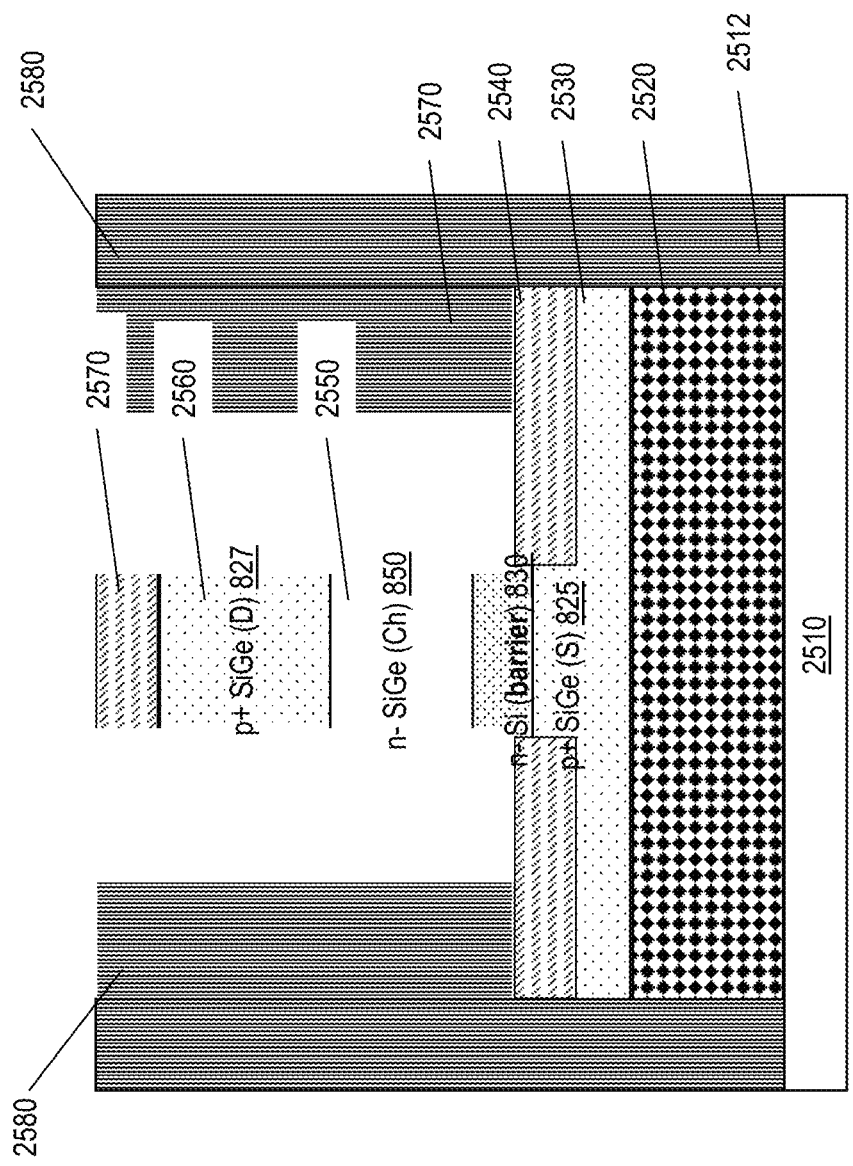
FIG. 30 depicts a cross-sectional view of a VFET structure after top spacer opening and top drain formation during an intermediate operation of the exemplary method of fabricating a semiconductor device according to one or more embodiments of the invention.

FIG. 30 depicts a cross-sectional view of a VFET structure after ILD opening during an intermediate operation of the exemplary method of fabricating a semiconductor device according to one or more embodiments of the invention. In some embodiments, a portion of the ILD 2580 is removed to expose portions of the semiconductor fins. In another embodiment, as depicted in FIG. 30, ILD 2580 is removed down to the spacer material 2540 to expose portions of the semiconductor fins.

Figure 31:
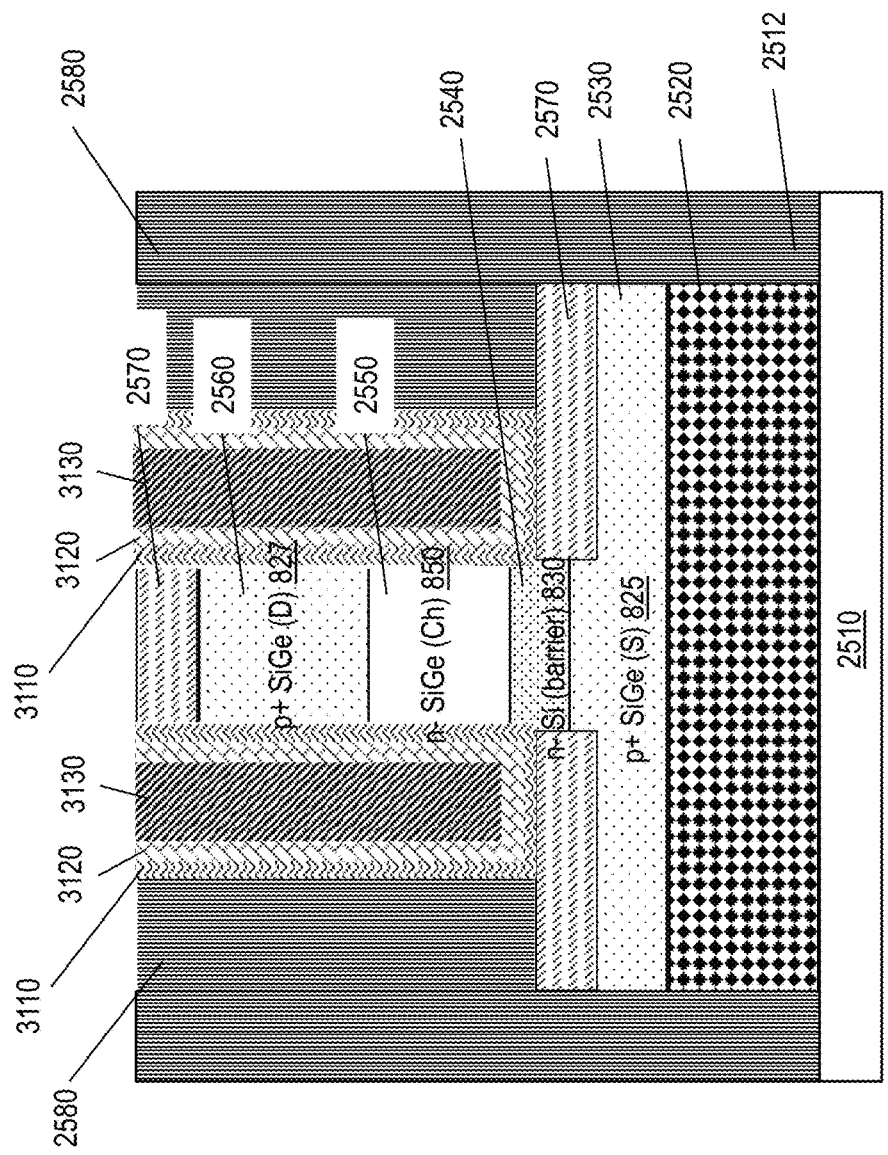
FIG. 31 depicts a cross-sectional view of a vertical HBFET structure during the fabrication according to one or more embodiments of the present invention.

FIG. 31 depicts a cross-sectional view of a vertical HBFET structure during the fabrication according to one or more embodiments of the present invention. A high-k material layer 3110 is deposited on the bottom spacer 845 layer 2570, side wall of dielectric 2580 and the side wall of semiconductor fin. The high-k material can be a dielectride such as an $HfO_2$, or any suitable gate material to form the gate stack 840. The high dielectric gate oxide can be formed by, for example, deposition, over channel regions (i.e., sidewalls) of the semiconductor fins and the bottom spacer 845.

The high-k dielectric layer 3110 can be made of any suitable gate material, such as, for example, a high dielectric constant material having a dielectric constant greater than silicon dioxide. Exemplary high dielectric constant material include, for example, $HfO2$, $ZrO2$, $La2O3$, $Al2O3$, $TiO2$, $SrTiO3$, $LaAlO3$, $Y2O3$, $HfOxNy$, $ZrOxNy$, $La2OxNy$, $Al2OxNy$, $TiOxNy$, $SrTiOxNy$, $LaAlOxNy$, $Y2OxNy$, $SiON$, $SiNx$, a silicate thereof, and an alloy thereof, where each value of x is independently from 0.5 to 3 and each value of y is independently from 0 to 2.

Further, in one or more examples, a thin layer of metal, 3120, with specific work function (WF-metal) can be deposited, followed by a conductive material layer 3130 (gate-fill metal). The thin metal layer 3120 works to adjust the threshold voltage of the FET.

The gate conductor layer 3130 can be composed of metal and/or polysilicon or any other material(s) that serves as the gate electrode for the semiconductor device 2400. The conductive contact can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the conductive contact 3130 can be copper and can include a barrier metal liner (not depicted). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

In one or more examples, the depositions can be performed by filling the trench with the above layers and planarizing to a surface of the nitride layer 2570 using, for example, a CMP process.

Figure 32:
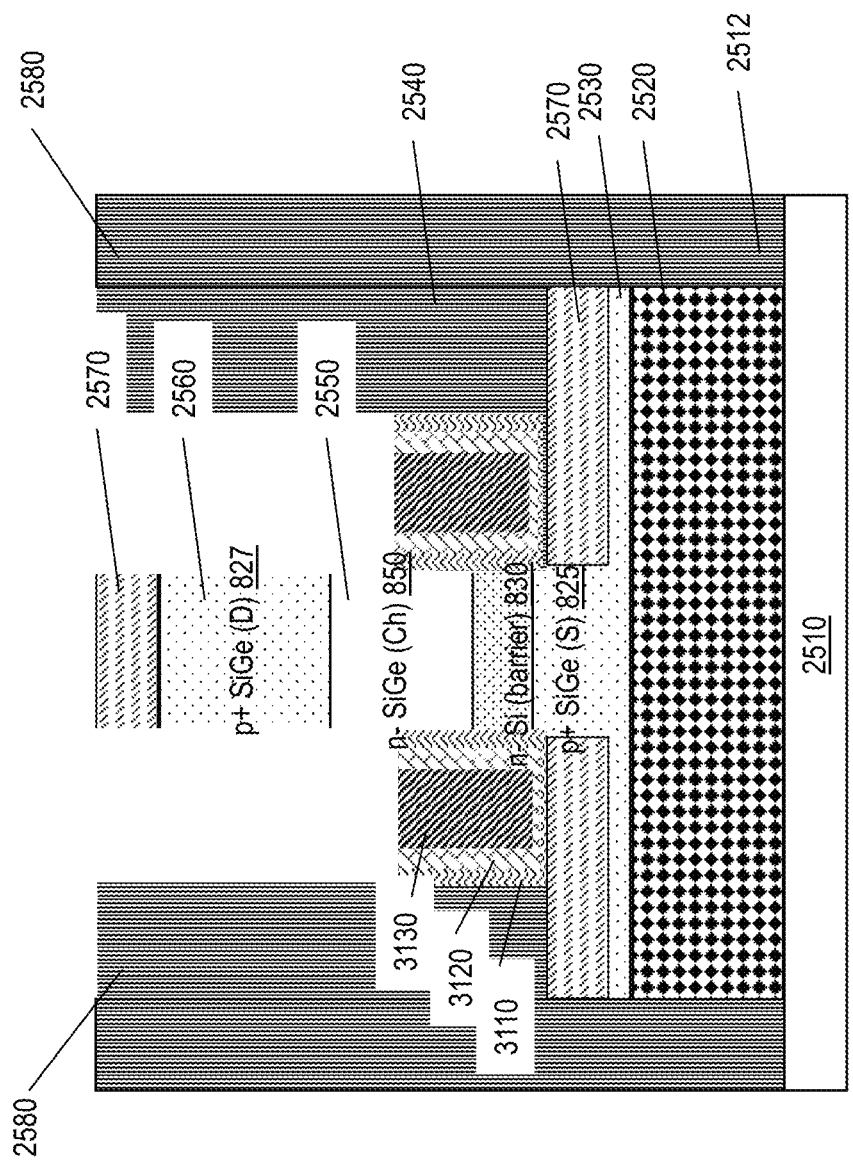
FIG. 32 depicts a cross-sectional view of a vertical HBFET structure during the fabrication according to one or more embodiments of the present invention.

FIG. 32 depicts a cross-sectional view of a vertical HBFET structure during the fabrication according to one or more embodiments of the present invention. Following the deposition of the gate stack layers as described earlier, an anisotropic etch of the gate-stack (high-k, WF-metal, gate-fill metal) is performed. The removal is performed using any lithographic or etching methodology, such as, for example, a RIE selective to the lithographic hard-mask material being used.

Figure 33:
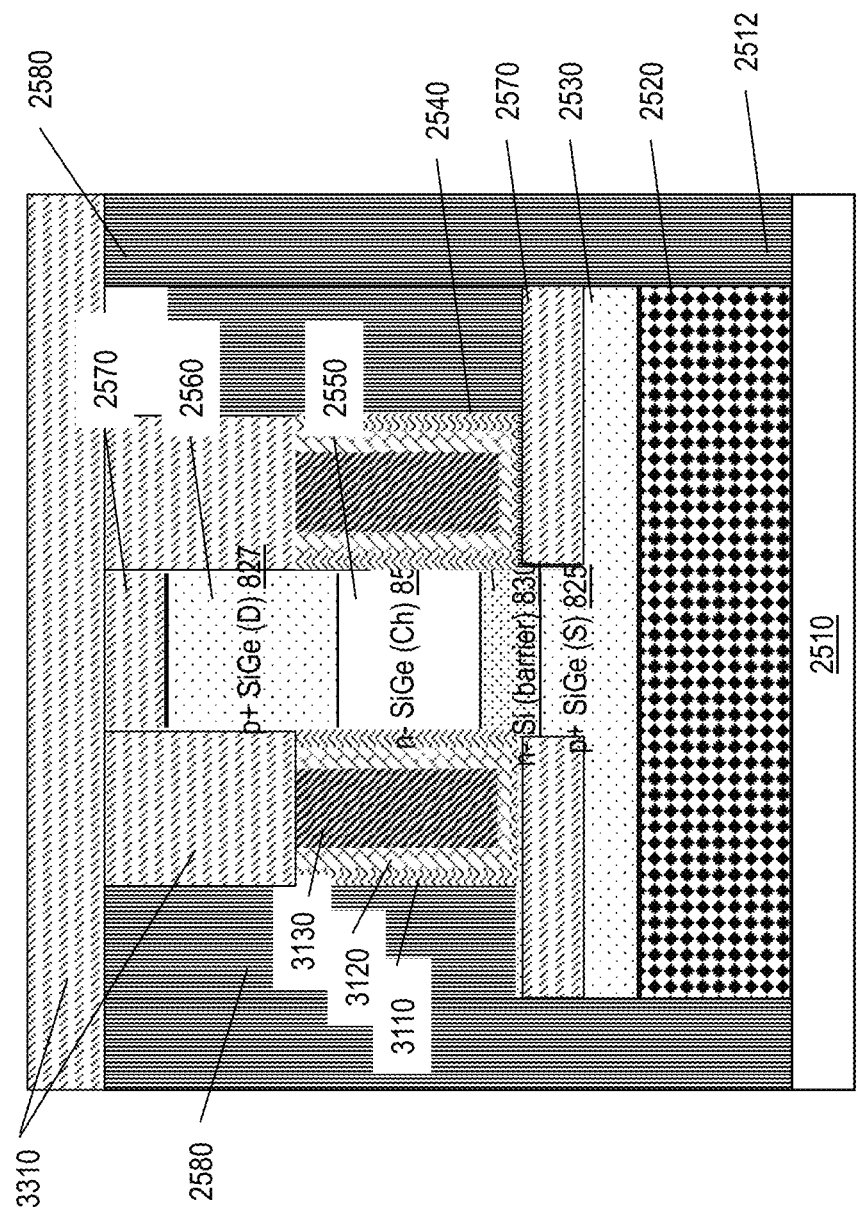
FIG. 33 depicts a cross-sectional view of a vertical HBFET structure during the fabrication according to one or more embodiments of the present invention.

FIG. 33 depicts a cross-sectional view of a vertical HBFET structure during the fabrication according to one or more embodiments of the present invention. The HBFET structure is filled with a top spacer material layer 3310. The top spacer material can be of the same material that was used in the layer 2570, and can include a dielectric material, such as silicon oxide, silicon nitride, silicon oxynitride, or a combination thereof, and can be formed using known deposition processes. In some embodiments, the spacer 3310 is deposited using a directional deposition process such as, for example, the GCIB process. The deposition is followed by a CMP process.

Figure 34:
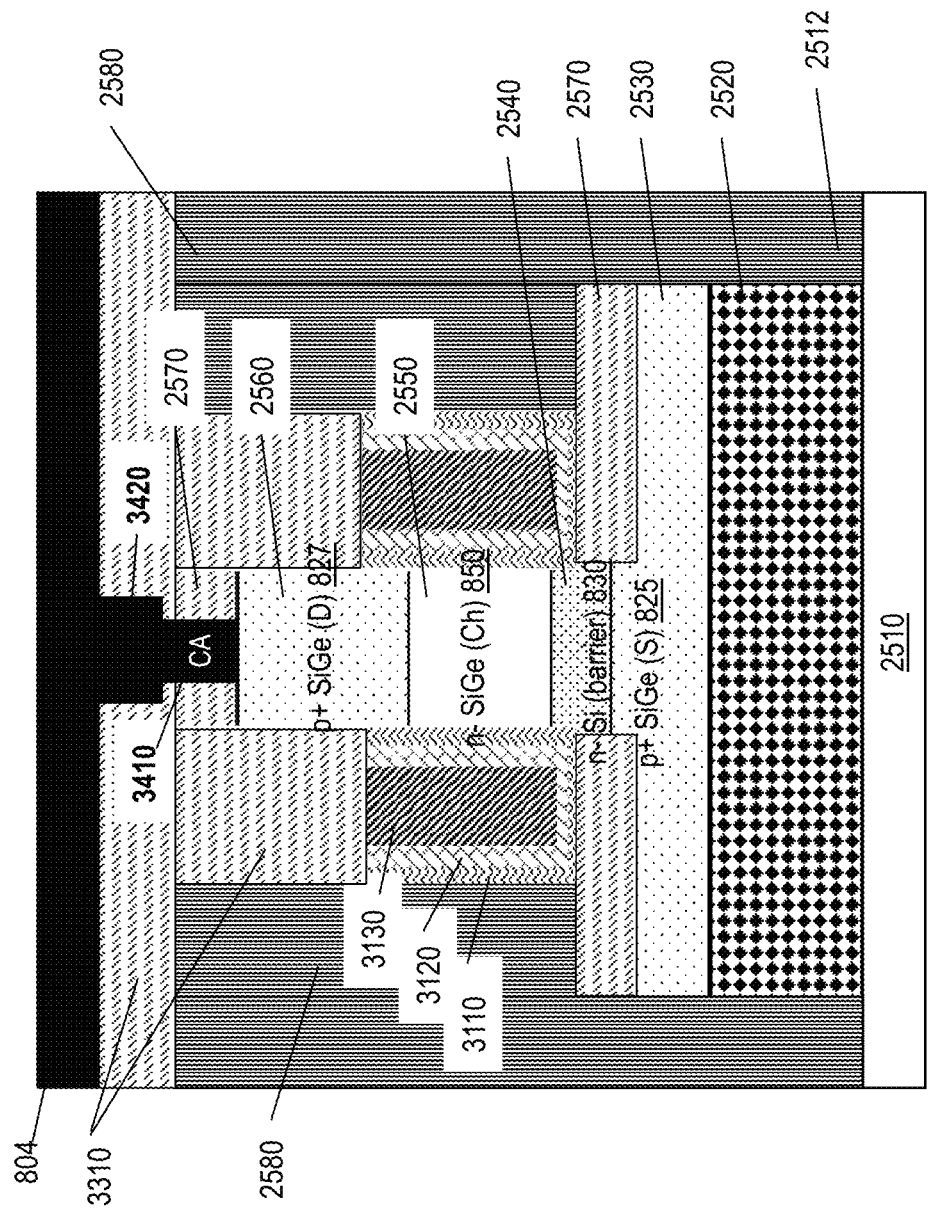
FIG. 34 depicts a cross-sectional view of a vertical HBFET structure during the fabrication according to one or more embodiments of the present invention.

FIG. 34 depicts a cross-sectional view of a vertical HBFET structure during the fabrication according to one or more embodiments of the present invention. Here, a middle of line processing is used to connect the HBFET structure 2400 with the row-wires of the RPU array 600 (804 is shown). The middle of line (MOL) processing includes etching a contact through a liner which is the silicon nitride used in the spacer layers such as 2570 and 3310. The contact etch passes through the silicon oxide layer and the silicon nitride layer to make contact with the semiconductor region, and more particularly, the active crystalline semiconductor region 2560 forming the drain 827. In regions where contacts to the bottom conducting layer 2530 are made (that form the column-wise conductors 808, 810), the contact etch passes through the silicon oxide layer and the silicon nitride layer to make contact with the semiconductor layer 2530 (not shown).

In one or more examples, the MOL liner is deposited using plasma enhanced chemical vapor deposition (PECVD) overlying the semiconductor structure. By using a plasma enhanced chemical vapor deposition, the amount of MOL liner deposited in the core region and the periphery region can be controlled depending on the distances between transistors in the core region and periphery region.

Further, in one or more examples, upon depositing the MOL liner, an insulative layer (not shown) is deposited in-between the HBVFET and the row wire 802. For example, the insulative layer includes an insulative material, such as silicon nitride, silicon oxide, silicon oxynitride, or borophosphosilicate glass (BPSG). The insulative layer can be composed of more than one layer of insulative material.

Upon depositing the insulative layer, a contact etch is performed through the MOL liner. A contact etch 3410 is performed through the nitride layers 2570 and 3310. The contact etch 3410 allows an active contact (CA), which overlies the surface of the semiconductor structure, to be electrically connected with the drain of the HBFET. Further, a vertical interconnect layer (V0) 3420 is formed and deposited to connect the contact 3410 with the row wire 804.

FIG. 35 depicts connections between the HBFET 2400 and the RPU array 600 according to one or more embodiments of the present invention. FIG. 36 depicts a cross-sectional view of a vertical HBFET structure during the fabrication according to one or more embodiments of the present invention to connect the HBFET 2400 to the RPU array 600. As described earlier an active contact (CA) is created between the row wire 804 and the terminal of the HBFET 2400 (FIG. 34). Further, by patterning the conducting material and using the MOL processing, a contact to the gate (CB) 3510 is created to connect the HBFET to the other circuitry 2410 at the crosspoint of the RPU array 600, such as the capacitor 1510 etc. The capacitor 1510 can be the weight storage capacitor.

The VFET structure can be patterned using, for example, RIE. In some embodiments, the RIE is selective to the substrate 2510. The resulting structure includes an energy barrier 830 as described herein.

The FET structures discussed so far include a gate structure, composed of polysilicon and/or a metal, formed on and contacting an insulator placed on top of the semiconductor layer positioned between the source and the drain. The semiconductor layer can include various dopants therein, with one type of doping in the source and drain, and another type of doping in the channel and the energy barrier layer. By applying a voltage to the gate structure, an electrically conductive channel can be created within the semiconductor layer between the source and drain terminals. The energy barrier region 830 was fabricated in these structures to create a controllable high resistance.

In additional embodiments of the present invention, the FET structure can use an alternative FET structure, known as a tunnel FET, which includes a gate contact separated from semiconductor layer by an oxide layer. The semiconductor layer can include multiple types of semiconducting materials and dopants, such that controlling a voltage of the gate influences current flow between a source contact and a drain contact at two ends of the semiconductor layer. In such tunnel FET embodiments, compared to the diffusion FET and HBFET structures, where the source and drain are doped same type, the doping of the source and drain of a tunneling FET are different types.

Figure 37:
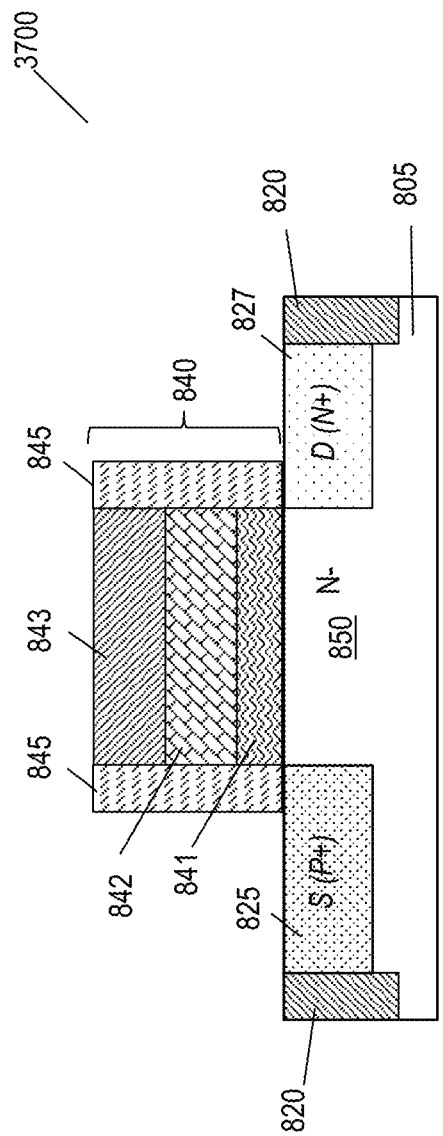
FIG. 37 depicts an embodiment of a tunnel FET 3700 according to one or more embodiments of the present invention.

FIG. 37 depicts an embodiment of a tunnel FET 3700 according to one or more embodiments of the present invention. The tunnel FET 3700, compared to the diffusion FET described earlier (see FIG. 14, for example) does not include an energy barrier region 830. Instead, in the tunnel FET 3700, the entire source terminal 825 is doped P+, different from the drain terminal 827, which is doped N+ in the illustrated example. It should be noted that in other examples, the source terminal 825 can be doped N+ and the drain terminal 827 is doped P+. Further, the channel 850 is doped using the same dopant as the drain terminal, but with a lighter concentration in comparison to the drain 827.

In one or more examples, the doping can be performed using ion implantation, using patterned masks to cover one region while the other region is being doped. For example, the source terminal 825 can be covered while the drain terminal 827 is doped N+, and subsequently, the drain terminal 827 is covered while the source terminal 825 is doped P+.

Figure 38:
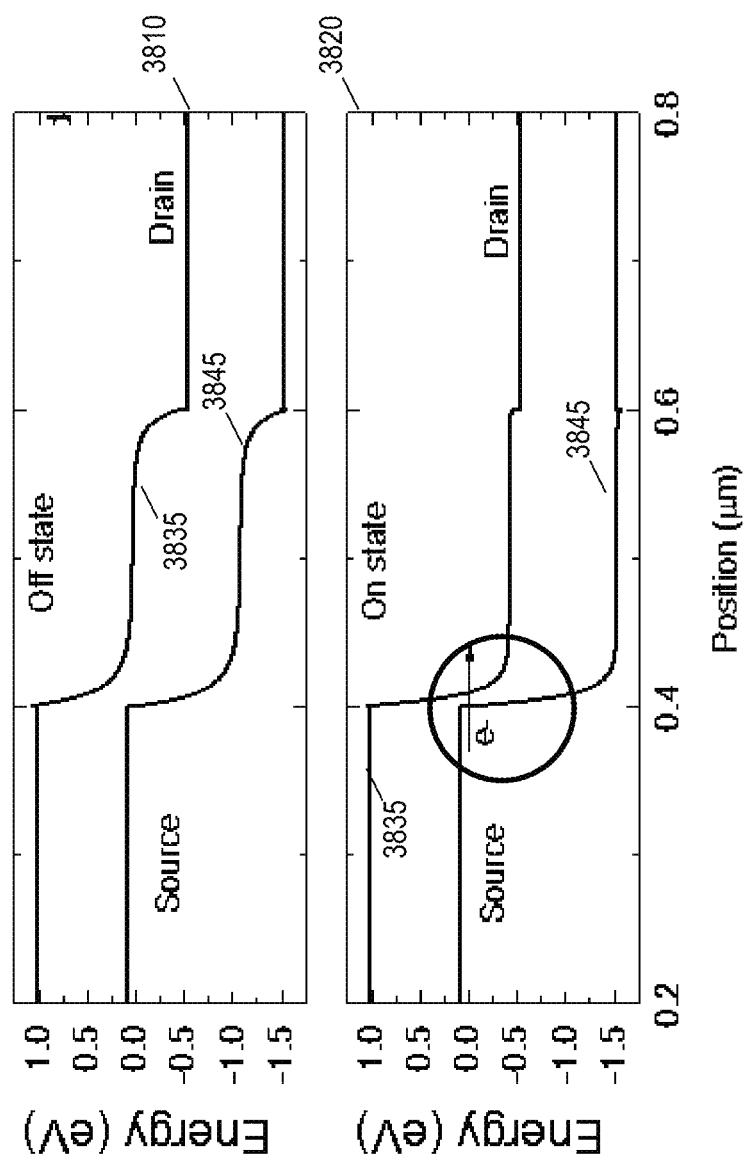
FIG. 38 depicts an effect of the tunnel FET structure described herein on the current level according to one or more embodiments of the present invention.

FIG. 38 depicts an effect of the tunnel FET structure described herein on the current level according to one or more embodiments of the present invention. Plot 3810 depicts an ON state of a diffusion FET and plot 3820 depicts an OFF state. In both plots, a valence band 3835 and a conduction band 3845 are shown. Typically, in a tunneling FET, the "ON" state current is dominated by the band to band tunneling of charge carriers. The current level is determined by the shape of the barrier between source 825 and channel 850. The resistance of such FET can be modulated by the doping of source 825 and channel 850 and is a function of gate and drain bias.

FIG. 39 depicts an effect of the tunnel FET structure described herein on the current level according to one or more embodiments of the present invention. The illustrated plot shows a comparison of a first transfer characteristic 3910 of a typical FET, and a second transfer characteristic 3920 of the tunnel FET 3700 with the source doping different than the drain and channel doping. As can be seen, the tunnel FET 3700 has a lower current. It should be noted that the plots in FIG. 39 illustrate result values from one example scenario, and that in other examples, the plots can be different from those illustrated.

FIG. 40 depicts an effect of the energy barrier in the tunnel FET structure described herein on the current level according to one or more embodiments of the present invention. The illustrated plot shows resistance of the tunnel FET as a function of gate voltage with different concentrations of doping at the source terminal 825. For example, the plot depicts the doping concentration at $4 \times 10^{20}$ cm$^{-3}$ (4010), $6 \times 10^{20}$ cm$^{-3}$ (4020), $8 \times 10^{20}$ cm$^{-3}$ (4030), and $1 \times 10^{21}$ cm$^{-3}$ (4040), respectively. It should be noted that the value the concentration can be different from the above exemplary values, causing the FET resistance to change in a different manner than what is shown in FIG. 40.

Referring back to FIG. 37, the tunnel FET structure further includes a gate stack 840 (e.g., a gate dielectric layer 841, a gate conductor layer 842 on the gate dielectric layer 841 and a cap layer 843, such as a nitride cap layer, on the gate conductor layer 842) over the designated channel region 850 within the device region. Further, gate sidewall spacers 845 are formed on opposing sides of the gate stack 840.

Further, in order to store the weight in the tunnel FET 3700, the gate potential of the FET device 3700 is kept at a certain value. This can be realized through different structures.

Figure 41:
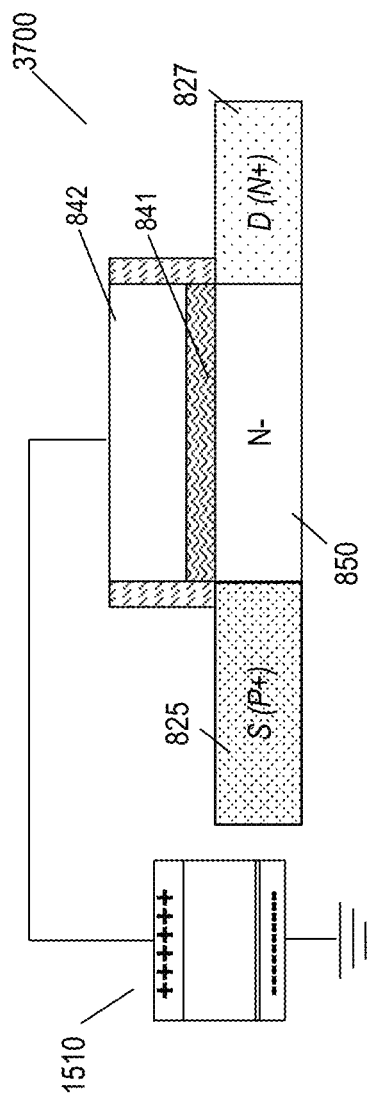
FIG. 41 depicts an embodiment to store the weight in the tunnel FET 3700 according to one or more embodiments of the present invention.

FIG. 41 depicts an embodiment to store the weight in the tunnel FET 3700 according to one or more embodiments of the present invention. The tunnel FET 3700 is connected with a capacitor 1510, for example from the other circuitry 2410 at each of the crosspoints in RPU array 600. The charge is stored at the plate to provide the gate voltage, the charge stored being representative of the weight stored at the crosspoint in the RPU array 600. It should be noted that only some of the parts of the FET device 3700 are shown in FIG. 41 for simplicity of illustration.

Figure 42:
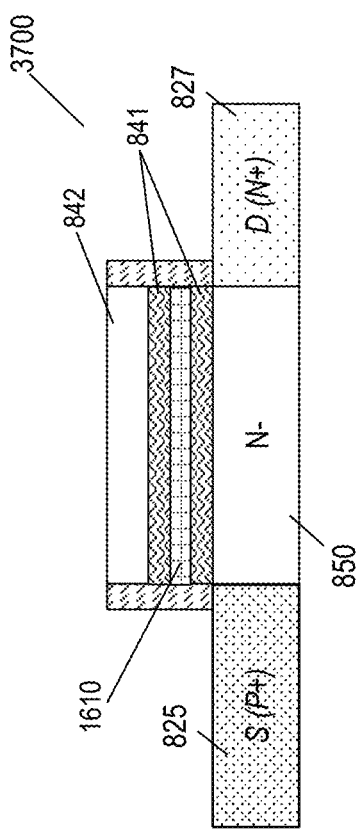
FIG. 42 depicts an embodiment to store the weight in the tunnel FET 3700 according to one or more embodiments of the present invention.

FIG. 42 depicts an embodiment to store the weight in the tunnel FET 3700 according to one or more embodiments of the present invention. A charge storage layer 1610, such as a floating gate is added to the gate stack 840. The charge can be stored in the charge storing layer 1610 to provide the gate voltage. The charge storing layer 1610 is composed of polysilicon. In one or more examples, another the gate dielectric layer 841 is added after the charge storing layer 1610, followed by the further layers in the gate stack 840, such as the conductive material layer 842 for the electrode.

Figure 43:
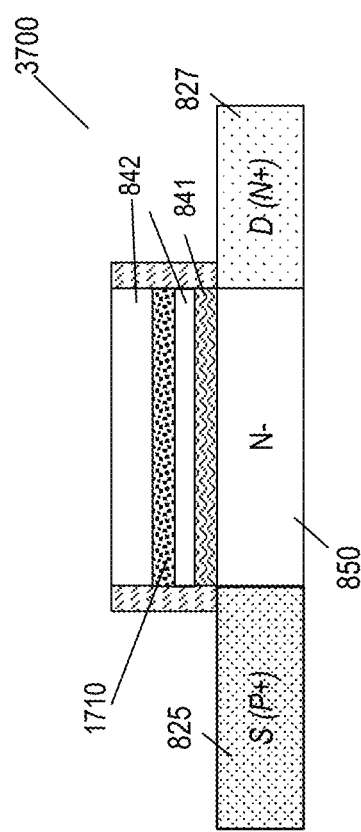
FIG. 43 depicts another embodiment to store the weight in the tunnel FET 3700 according to one or more embodiments of the present invention.

FIG. 43 depicts another embodiment to store the weight in the tunnel FET 3700 according to one or more embodiments of the present invention. Here, the gate stack includes the gate dielectric layer 841 followed by a first conductive material layer 842. A ferroelelectric material layer 1710 is added subsequently, such as composed of hafnium dioxide (HfO2). The polarization of the ferroelectric layer 1710 provides the gate voltage. Further, the gate stack 840 includes a second conductive material layer 842 to form the control gate electrode. The first conductive material layer 842 addresses a technical challenge of depolarization of the ferroelectric material layer 1710.

The FET structures described herein provide an asymmetric structure, for example because of the energy barrier 830, or the different doping of the source and drain/channel. Because of the asymmetric structure of the device, readout during forward and backward are applied in different ways.

Figure 44:
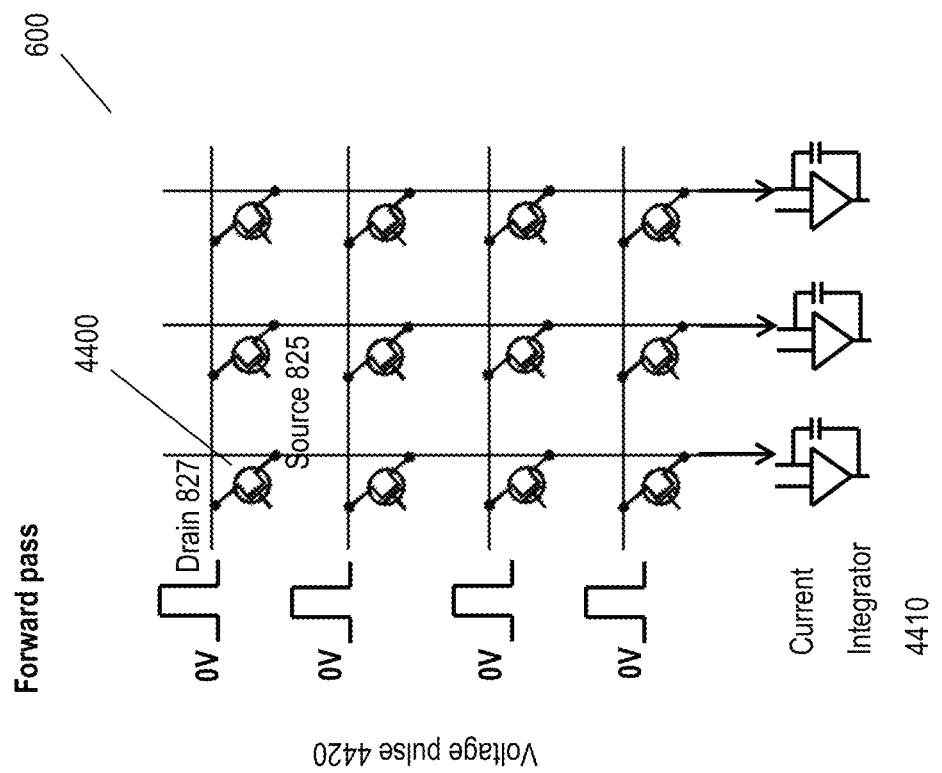
FIG. 44 depicts a forward pass using the RPU array with the asymmetric FET structures described herein according to one or more embodiments of the present invention.

FIG. 44 depicts a forward pass using the RPU array with the asymmetric FET structures described herein according to one or more embodiments of the present invention. As depicted, the RPU array 600 includes an asymmetric FET 4400 (diffusion FET 800, HBFET 1400, or tunnel FET 3700) at each crosspoint. During the forward pass voltage pulses 4420 are applied at each row of the RPU array 600, and the resulting currents in the columns are summed using current integrators 4410. In the forward path, the source terminal 825 of the FET 4400 is connected to the current integrator 4410 of the corresponding column, and a positive pulse is applied to the drain terminal 827 of the FET 4400. Accordingly, the current via the FET 4400 is affected by the controllable resistance of the FET 4400 during the forward pass.

Figure 45:
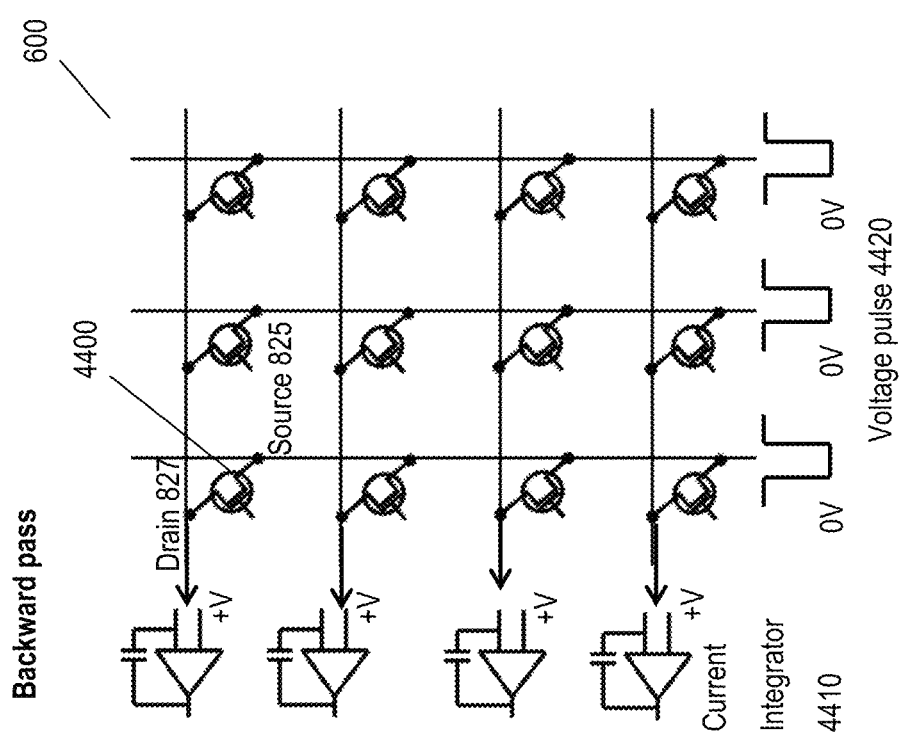
FIG. 45 depicts a backward pass using the RPU array with the asymmetric FET structures described herein according to one or more embodiments of the present invention.

FIG. 45 depicts a backward pass using the RPU array with the asymmetric FET structures described herein according to one or more embodiments of the present invention. As depicted, the RPU array 600 includes an asymmetric FET 4400 (diffusion FET 800, HBFET 1400, or tunnel FET 3700) at each crosspoint. During the backward pass voltage pulses 4420 are applied at each column of the RPU array 600, and the resulting currents in the rows are summed using current integrators 4410. During backward pass, the base voltage at source 825 and drain 827 is shifted to a positive value +V. The drain terminal 827 of the FET 4400 is connected to the current integrator 4410 of the corresponding row, and a negative pulse is applied to the source terminal 825 of the FET 4400. Accordingly, the current via the FET 4400 is affected by the controllable resistance of the FET 4400 during the backward pass.

Further, according to one or more embodiments of the present invention, the RPU array 600 can be implemented using symmetric FET structures. The diffusion based FET 800 and the HBFET 1800, that include an energy barrier 830 can be fabricated with a substantially same energy barrier 830' on the drain side to make the FET device structure symmetric.

Figure 46:
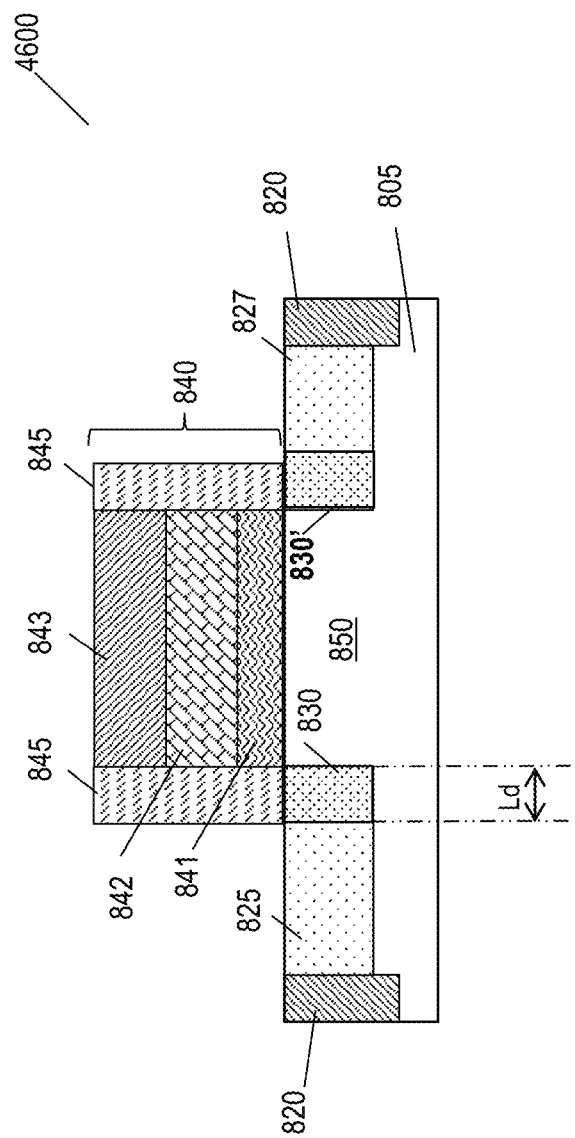
FIG. 46 depicts an example symmetric semiconductor structure for the diffusion FET according to one or more embodiments of the present invention.

FIG. 46 depicts an example symmetric semiconductor structure for the diffusion FET according to one or more embodiments of the present invention. In this embodiment, the diffusion FET includes a pair of energy barriers, a first energy barrier 830 between the source 825 and the channel 850, and a second energy barrier 830' between the channel 850 and the drain 827. The energy barrier regions 830 and 830' are composed of the same material that is doped with heavier (higher) concentration than the channel 850.

Figure 47:
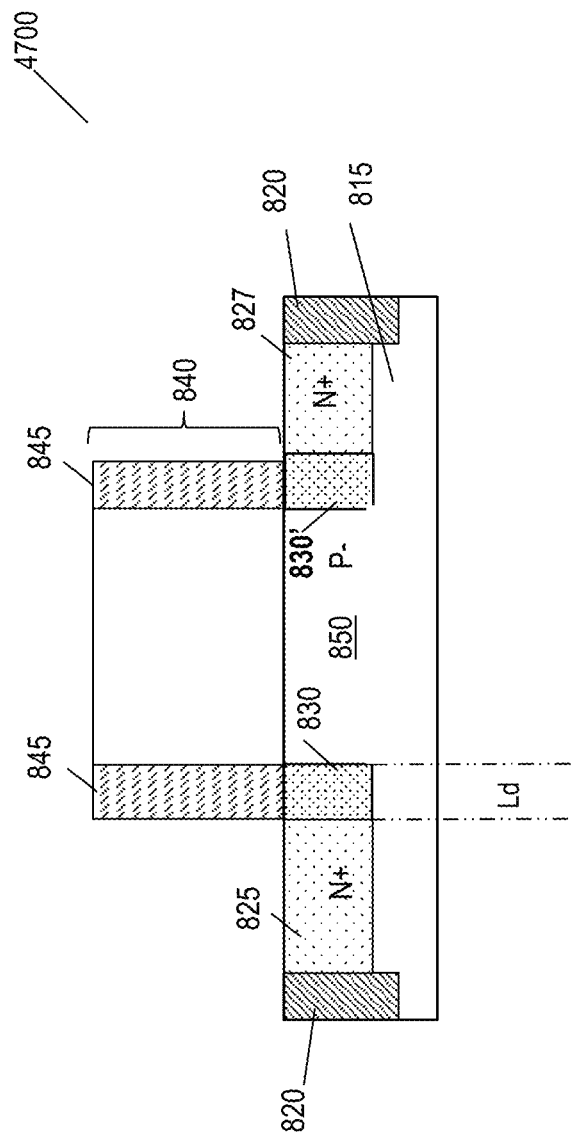
FIG. 47 depicts an example symmetric semiconductor structure for the HBFET according to one or more embodiments of the present invention.

FIG. 47 depicts an example symmetric semiconductor structure for the HBFET according to one or more embodiments of the present invention. In this embodiment, the HBFET includes a pair of energy barriers, a first energy barrier 830 between the source 825 and the channel 850, and a second energy barrier 830' between the channel 850 and the drain 827. The energy barrier regions 830 and 830' are composed of the same material to form a hetero-barrier, such as indium phosphide (InP), or Si, depending on whether a III-V structure or a Si—SiGe structure is used.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a source terminal of a semiconductor fin on a substrate;
    forming an energy barrier on a surface of the source terminal;
    forming a channel on a surface of the energy barrier;
    forming a drain terminal on a surface of the channel;
    recessing the drain terminal and the channel on either sides of the channel;
    etching the energy barrier in recesses formed by the recessing;
    recessing the source terminal using timed etching to remove a portion of the source terminal in recesses formed by etching the energy barrier;
    forming a first bottom spacer on a surface of the source terminal and a sidewall of the semiconductor fin; and
    forming a gate stack on a surface of the first bottom spacer.

2. The method of claim 1 further comprising:
    etching the gate stack;
    forming a second bottom spacer on a surface of the gate stack;
    forming an active contact connecting the drain terminal with a first line; and
    forming a gate contact connecting the gate stack with a second line.

3. The method of claim 1, wherein the first bottom spacer is composed of a silicon nitride, the drain terminal and the source terminal are composed of P+ doped SiGe, and the channel is composed of N− doped SiGe, and the energy barrier is composed of Si.

* * * * *